United States Patent
Keum et al.

(10) Patent No.: US 6,858,854 B2
(45) Date of Patent: Feb. 22, 2005

(54) METHOD AND APPARATUS FOR MEASURING INCLINATION ANGLE OF ION BEAM

(75) Inventors: Gyeong-Su Keum, Gyeonggi-do (KR); Jae-Im Yun, Gyeonggi-do (KR); Hyung-Sik Hong, Gyeonggi-do (KR); Chung-Hun Park, Gyeonggi-do (KR); Wan-Goo Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/401,548

(22) Filed: Mar. 31, 2003

(65) Prior Publication Data

US 2003/0197132 A1 Oct. 23, 2003

(30) Foreign Application Priority Data

Apr. 18, 2002 (KR) ........................................ 2002-21319

(51) Int. Cl.[7] .............................................. H01J 37/317
(52) U.S. Cl. ............................. 250/492.21; 250/442.11; 313/360.1; 285/114
(58) Field of Search ...................... 250/492.21, 442.11, 250/397; 313/360.1; 285/114; 324/71.3–71.4

(56) References Cited

U.S. PATENT DOCUMENTS

| | | | |
|---|---|---|---|
| 6,313,474 B1 * | 11/2001 | Iwasawa et al. | 250/492.21 |
| 2002/0123161 A1 * | 9/2002 | Ushiki et al. | |
| 2003/0094583 A1 * | 5/2003 | Jang et al. | |

FOREIGN PATENT DOCUMENTS

| | | |
|---|---|---|
| JP | 1122450 | 5/1989 |
| JP | 1140912 | 6/1989 |
| KR | 2001-54277 | 7/2001 |

OTHER PUBLICATIONS

"Surface Contamination Analyzer for Semiconductor Wafers . . . ".*
"Wafer Holding Apparatus for Ion Implantation System".*

* cited by examiner

*Primary Examiner*—Nikita Wells
*Assistant Examiner*—Zia R. Hashmi
(74) *Attorney, Agent, or Firm*—Volentine Francos & Whitt, PLLC

(57) ABSTRACT

A method and an apparatus for measuring an inclination angle of an ion beam when ions are implanted into a semiconductor wafer include an ion current measuring section having a Faraday cup assembly which is rotatably installed, an angle varying section for adjusting an alignment angle of the Faraday cup assembly, and an inclination angle measuring section for measuring the inclination angle of the ion beam based on a variation of the ion current caused by a variation of the alignment angle of the Faraday cup assembly. By measuring the inclination angle of the ion beam, the incident angle of the ion beam, which is incident into the wafer during the ion implantation process, can be precisely adjusted to a predetermined critical angle. Accordingly, the channeling effect and shadow effect can be effectively prevented. The amount of the ions included in the ion beam can be precisely measured, so the amount of ions implanted into the wafer can be precisely adjusted.

36 Claims, 17 Drawing Sheets

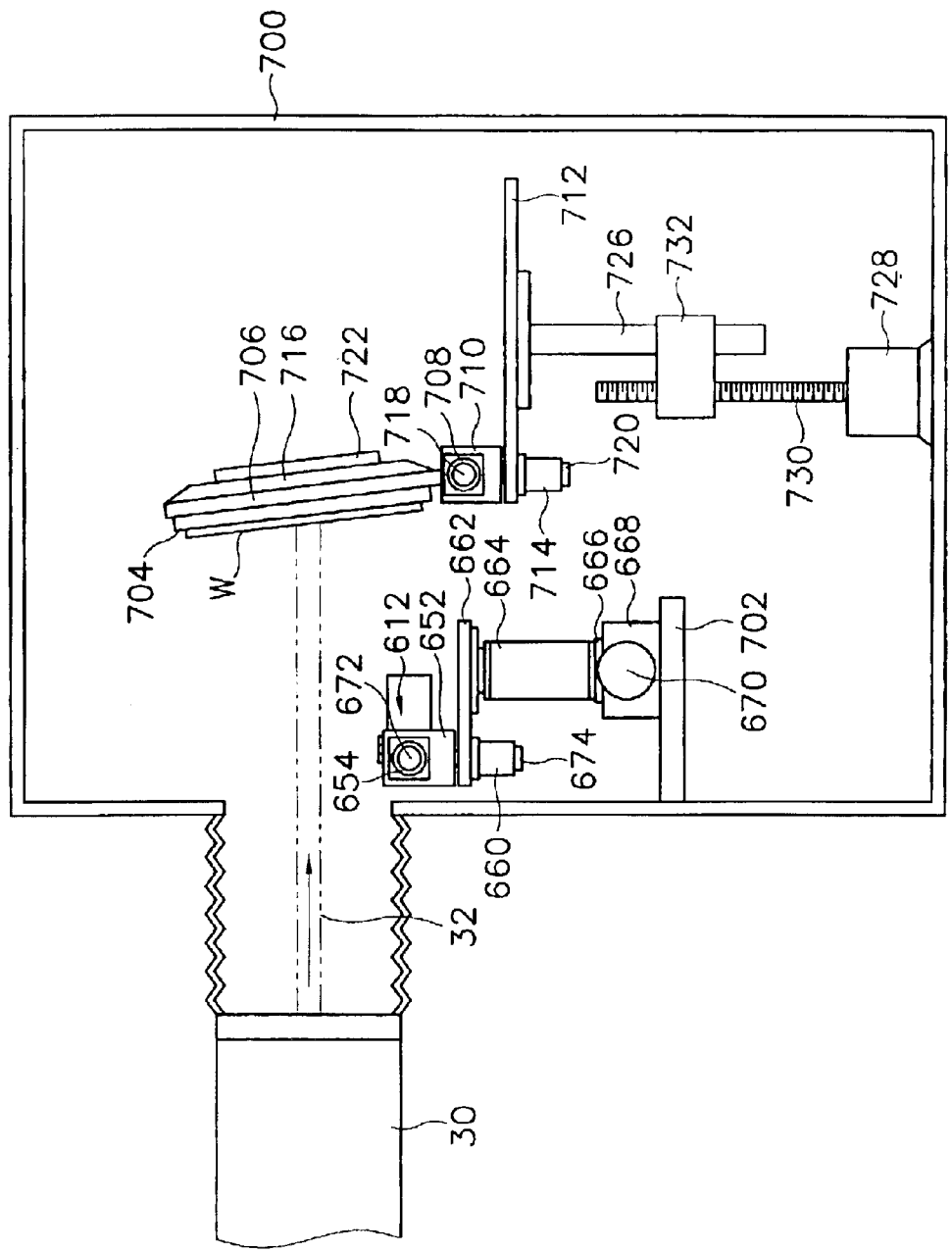

METHOD AND APPARATUS FOR MEASURING INCLINATION ANGLE OF ION BEAM

CROSS REFERENCES TO RELATED APPLICATIONS

This application claims priority under 35 U.S.C. §119 from Korean Patent Application No. 2002-0021319, filed on Apr. 18, 2002, the contents of which are hereby incorporated by reference in their entirety for all purposes as if fully set forth herein.

BACKGROUND AND SUMMARY

1. Technical Field

The present invention relates to a method and an apparatus for measuring an ion beam inclination of an ion implantation apparatus for manufacturing a semiconductor device, and more particularly to a method and an apparatus for measuring an inclination angle of an ion beam by using ions implanted into an ion current.

2. Description

Generally, a semiconductor device is manufactured by repeatedly performing various unit processes, such as deposition, photolithography, etching, ion implantation, polishing, cleaning and drying processes. When the ion implantation process is carried out, an ion beam including predetermined ions collides with a predetermined region of a semiconductor wafer, thereby implanting ions into the predetermined region of the semiconductor wafer. As compared with a thermal diffusing technique, the ion implantation process has an advantage that the number of ions implanted into a predetermined region and the implantation depth can be adjusted. Examples of ion implantation apparatuses and ion implantation systems are disclosed in U.S. Pat. No. 5,343.047 (issued to Ono, et. al) and U.S. Pat. No. 5,641,969 (issued to Cooke, et. al).

The amount of ions implanted into the ion current is adjusted based on the ion current measured by a Faraday cup assembly. In addition, in order to avoid the channeling effect that ions implanted into the ion current pass through an empty space, the ion current is required to have a predetermined inclination angle. That is, when the ion beam is horizontally incident into the ion current, the ion current has an inclination angle of 7° with respect to a vertical plane. However, even when a central axis of an ion source is in parallel with a horizontal plane, it cannot be measured whether or not the advancing direction of the ion beam is in parallel with the horizontal plane. If the advancing direction of the ion beam is not in parallel with the horizontal plane, the channeling effect or a shadow effect created by a mask formed on the ion current is generated.

In addition, if the advancing direction of the ion beam is not in parallel with the horizontal plane, the Faraday cup assembly cannot precisely measure the ion current, because the amount of the ions accommodated in the horizontally positioned Faraday cup assembly varies depending on the inclination angle of the ion beam with respect to the horizontal plane. For this reason, the real amount of ions implanted into the ion current is different from an intended amount of ions, thereby causing process failures such as an overdose or an underdose.

It is a first object of the present invention to provide a method for measuring an inclination angle of an ion beam incident into a predetermined region of an ion current and a method for implanting ions into the predetermined region of the ion current.

A second object of the present invention is to provide an apparatus for measuring an inclination angle of an ion beam incident into a predetermined region of an ion current and an apparatus for implanting ions into the predetermined region of the ion current.

In one aspect, the present invention provides a method for measuring an inclination angle of an ion beam. In the above method, the ion beam supplied from an ion source is received and a variation of an ion current of the ion beam is measured while varying an angle of the ion beam to be received. The inclination angle of the ion beam is calculated based on the variation of the ion current.

According to another aspect of the present invention, there is provided a method for measuring an inclination angle of an ion beam. A Faraday cup assembly is installed in an advancing path of the ion beam supplied from an ion source, to receive the ion beam. A first variation of the ion current caused by the ion beam received in the Faraday cup assembly is measured by rotating the Faraday cup assembly about a horizontal axis, which is vertically crossed with a vertical plane including a central axis of the ion source and passes through the Faraday cup assembly. A first maximum value of the ion current from the first variation is detected and a first inclination angle of the ion beam is calculated based on a first rotation angle, which is corresponding to the first maximum value, of the Faraday cup assembly rotated about the horizontal axis. A second variation of the ion current is measured by rotating the Faraday cup assembly about a vertical axis, which passes through a cross point of the central axis of the ion source and the horizontal axis and a second maximum value of the ion current the second variation is detected and a second inclination angle of the ion beam is calculated based a second rotation angle, which corresponds to the second maximum value, of the Faraday cup assembly rotated about the vertical axis.

According to still another aspect of the present invention, there is provided a method for implanting ions. In the method, an ion beam supplied from an ion source is received and a variation of an ion current of the ion beam is measured while varying an angle of the ion beam to be received. An inclination angle of the ion beam is calculated based on an angle of the ion beam to be received and the variation of the ion current. After placing a wafer having a critical angle, corrected according to the inclination angle of the ion beam, in an advancing path of the ion beam, ions of the ion beam are implanted into an entire surface of the wafer while moving the wafer.

In a further aspect, the present invention provides an apparatus for measuring an inclination angle of an ion beam. The apparatus includes a first means for receiving the ion beam supplied from an ion source, and for measuring an ion current of the received ion beam; a second means for varying an align angle of the first means to adjust an amount of the ion beam received in the first means; and a third means for calculating the inclination angle of the ion beam based on the align angle of the first means and the variation of the ion current caused by the variation of the align angle of the first means.

According to a still further aspect of the present invention, there is provided an apparatus for measuring an inclination angle of an ion beam. The apparatus includes: a Faraday cup assembly installed in an advancing path of the ion beam supplied from an ion source, to receive the ion beam; a current/voltage converting means for converting an ion current generated from the Faraday cup assembly due to the ion beam, into an ion voltage; a voltage measuring section for measuring the ion voltage; a driving means for rotating the Faraday cup assembly about a horizontal axis, which is vertically crossed with a vertical plane including the central axis of the ion source and passes through the Faraday cup assembly, to vary a first align angle of the Faraday cup assembly and for rotating the Faraday cup assembly about a vertical axis, which passes through a cross point of the central axis of the ion source and the horizontal axis, to vary a second align angle of the Faraday cup assembly; an angle measuring means for measuring a first rotation angle of the Faraday cup assembly rotated about the horizontal axis and a second rotation angle of the Faraday cup assembly rotated about the vertical axis; a data analyzing section connected to the voltage measuring section for detecting first and second maximum values of ion current measuring data by analyzing first and second variations of the ion current measuring data corresponding to the first and second align angles of the Faraday cup assembly and for calculating the inclination angle of the ion beam based on the first and second rotation angles corresponding to the first and second maximum values; and an angle adjusting section for generating a control signal to adjust the first and second align angles of the Faraday cup assembly.

According to yet a further aspect of the present invention, to accomplish the second object, there is provided an ion implantation apparatus. The ion implantation apparatus includes: an ion implantation chamber for performing an ion implantation process with respect to a wafer and including a chuck for gripping the wafer; an ion source connected to the ion implantation chamber for supplying an ion beam including ions into the ion implantation chamber; an ion current measuring means installed in an advancing path of the ion beam when measuring an inclination angle of the ion beam for receiving the ion beam and for measuring an ion current of the ion beam received therein; an angle varying means for varying an align angle of the ion current measuring means so as to adjust an amount of the ion beam received in the ion current measuring means; an inclination angle calculating means for calculating the inclination angle of the ion beam based on the align angle of the ion current measuring means and a variation of the ion current caused by a variation of the align angle of the ion current measuring means; a first driving means for driving the ion current measuring means up and down; and a second driving means for placing the wafer in the advancing path of the ion beam while ions are being implanted into the wafer, rotating the wafer with a critical angle corrected according to the inclination angle of the ion beam, and moving the wafer for allowing ions to be implanted into a whole area of the wafer.

By measuring the inclination angle of the ion beam, the incident angle of the ion beam, which is incident into the wafer during the ion implantation process, can be precisely adjusted to a predetermined critical angle. Accordingly, the channeling effect and shadow effect can be effectively prevented. The amount of the ions included in the ion beam can be precisely measured, so the amount of ions implanted into the wafer can be precisely adjusted.

BRIEF DESCRIPTION OF THE DRAWINGS

The above object and other advantages of the present invention will become more apparent by describing in detail preferred embodiments thereof with reference to the attached drawings, in which:

FIG. 18 is a view for explaining a process for implanting ions into a wafer having a critical angle corrected based on an ion beam inclination angle thereof.

DETAILED DESCRIPTION

Hereinafter, the present invention will be described in detail with reference to accompanying drawings.

Figure 1:
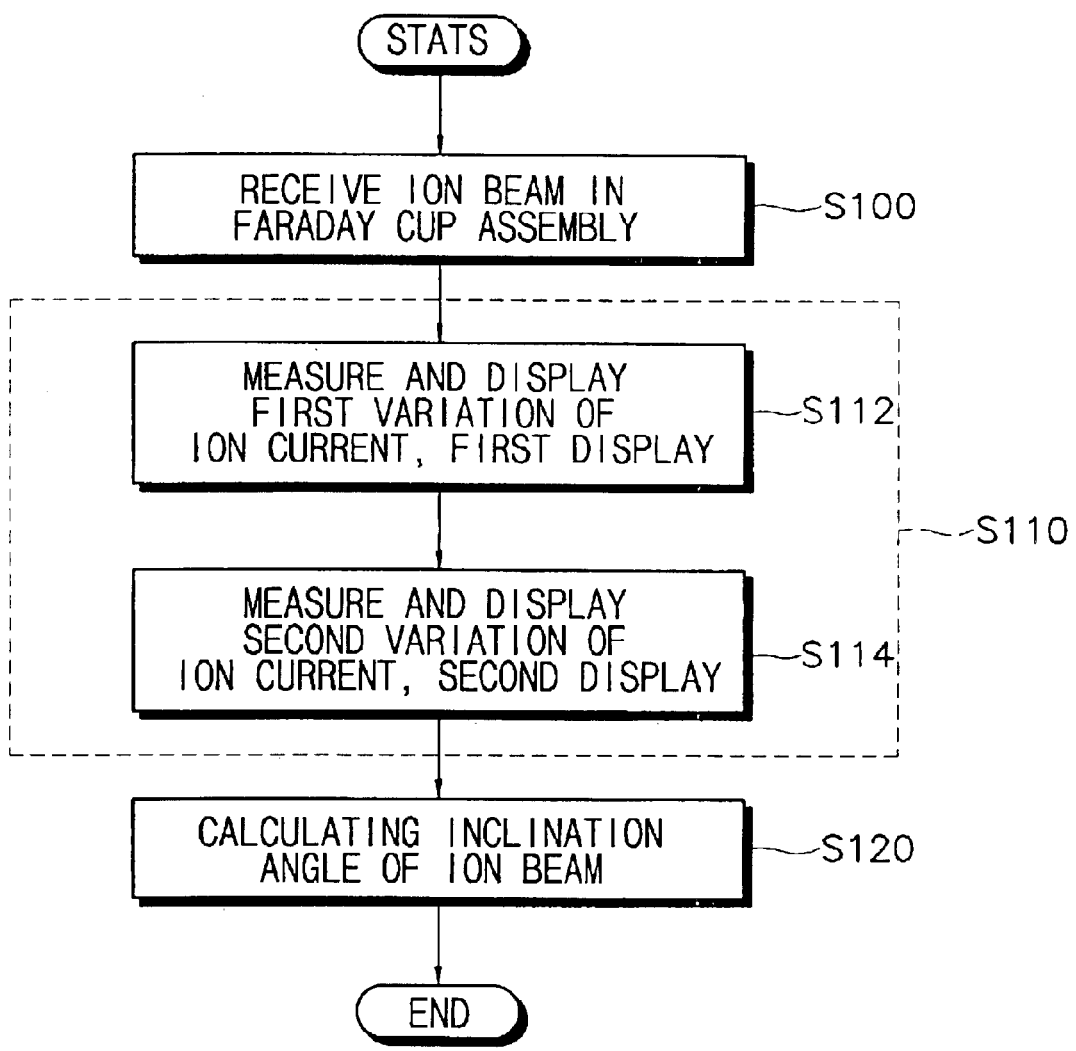
FIG. 1 is a flow chart showing a method for measuring an inclination angle of an ion beam according to a first embodiment.

FIG. 1 is a flow chart showing a method for measuring an inclination angle of an ion beam according to a first embodiment.

Referring to FIG. 1, a Faraday cup assembly for receiving an ion beam is positioned in an advancing path of the ion beam supplied from an ion source, and an ion current is measured by using the Faraday cup assembly (step S100). The ion source converts a source gas into plasma gas by using a thermal electron, and supplies the ion beam by extracting predetermined ions through a mass spectrometer and an accelerator. At this time, the ion beam consisting of the predetermined ions includes a spot ion beam having a circular cross-sectional area and a ribbon ion beam having a ribbon shape with a width in a horizontal direction. A central axis of the ion source is horizontally positioned, and the Faraday cup assembly receiving the ion beam for measuring the ion current of the ion beam is positioned in line with the central axis of the ion source.

Then, the variation of the ion beam is measured while varying the angle of the ion beam incident into the Faraday cup assembly (step S110).

In detail, the Faraday cup assembly rotates about a horizontal axis, which is vertically crossed with a vertical plane including the central axis of the ion source and passes through the Faraday cup assembly. At this time, the amount of the ion beam received in the Faraday cup assembly is varied according to a first rotation of the Faraday cup assembly about the horizontal axis and a first variation of the ion current is measured (step S112). It is sufficient to rotate the Faraday cup assembly corresponding to the incident angle of the ion beam received in the Faraday cup assembly, so the Faraday cup assembly rotates one time about a central axis of the ion source in a range of ±45°. The ion current is measured whenever the Faraday cup assembly rotates by 0.1°. The measuring angle of the ion current can be varied depending on the working conditions.

Then, the Faraday cup assembly is rotated about a vertical axis which passes through a cross point of the center axis and the horizontal axis of the ion source. The amount of the ion beam received in the Faraday cup assembly is varied according to a second rotation of the Faraday cup assembly about the vertical axis, and a second variation of the ion current is measured (step S114). In step S114, similar to step S112, the rotation angle of the Faraday cup assembly is ±45°, preferably ±10°, and the ion current is measured whenever the Faraday cup assembly rotates by 0.1°.

In steps S112 and S114, the ion current is measured as an ion voltage by an electric circuit connected to the Faraday cup assembly and a first display showing the first variation of the ion current and a second display showing the second variation of the ion current are carried out in real time.

Then, a first maximum value of the ion current is detected based on the first variation of the ion current, and a second maximum value of the ion current is detected based on the second variation of the ion current. In addition, an inclination angle of the ion beam is obtained based on first and second rotation angles of the Faraday cup assembly corresponding to the first and second maximum values of the ion current (step S120). In detail, the amount of the ion beam received in the Faraday cup assembly is maximized when the advancing direction of the ion beam matches with the central axis of the Faraday cup assembly, so the first and second rotation angles of the Faraday cup assembly corresponding to the first and second maximum values of the ion current are the same as in the inclination angle of the ion beam.

In step S100, when the Faraday cup assembly is in line with the central axis of the ion source, if the inclination angle of the ion beam is so large that the ion beam cannot be received in the Faraday cup assembly, the Faraday cup assembly is moved to a predetermined position so as to allow the ion beam to be received in the Faraday cup assembly. That is, the ion current is measured while vertically and horizontally moving the Faraday cup assembly by a predetermined distance and the position of the Faraday cup assembly is corrected based on the ion current.

Figure 2:
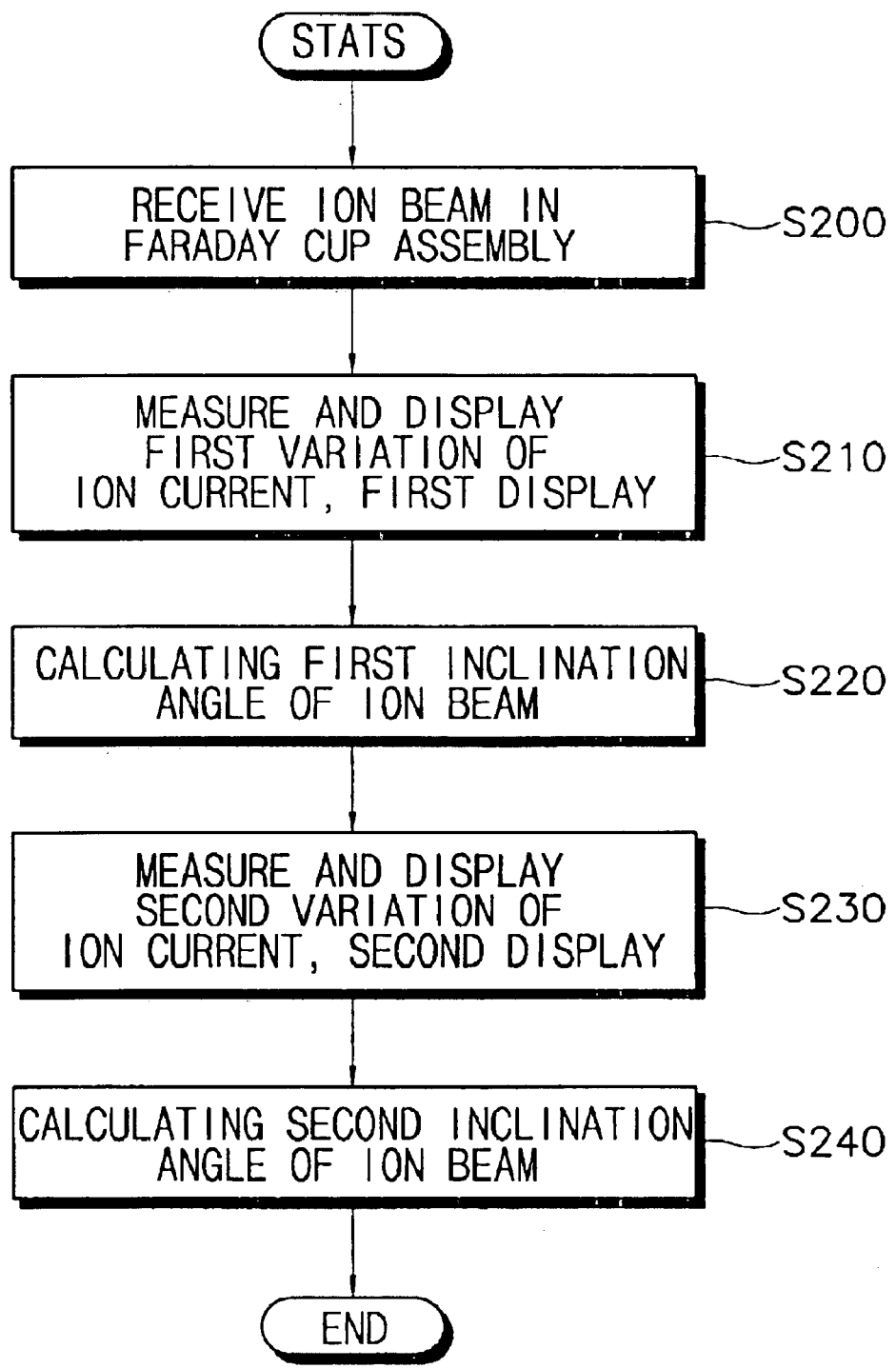
FIG. 2 is a flow chart showing a method for measuring an inclination angle of an ion beam according to a second embodiment.

FIG. 2 is a flow chart showing a method for measuring the inclination angle of the ion beam according to a second embodiment.

Referring to FIG. 2, the Faraday cup assembly is positioned in the advancing path of the ion beam supplied from an ion source so as to receive the ion beam therein (step S200). The ion beam includes a spot ion beam and a ribbon ion beam. The Faraday cup assembly is positioned in line with the central axis of the ion source. In this embodiment, the parts identical to the parts of the first embodiment will not be further explained below to avoid the redundancy.

The Faraday cup assembly is reciprocally rotated by a predetermined angle about the horizontal axis, which vertically crosses with the central axis of the ion source and passes through the Faraday cup assembly. Then, a first variation of the ion current varied according to a first rotation of the Faraday cup assembly about the horizontal axis is measured, and a first display showing a first variation of the ion current is carried out in real time (step S210).

A first maximum value of the ion current is detected based on the first variation and a first inclination angle of the ion beam is calculated from a first rotation angle of the Faraday cup assembly rotated about the central axis corresponding to the first maximum value (step S220). At this time, the first maximum value of the ion current can be detected after measuring the first variation of the ion current or can be simultaneously detected when measuring the first variation of the ion current. That is, since there is only one first maximum value, if the maximum value is detected from the measuring values showing the first variation of the ion current, the rotation of the Faraday cup assembly about the horizontal axis is stopped and the Faraday cup assembly is returned to its initial position.

Then, the Faraday cup assembly is reciprocally rotated by a predetermined angle about the vertical axis, which passes through a cross point between the central axis and the horizontal axis of the ion source. A second variation of the ion current varied according to a second rotation of the Faraday cup assembly about the vertical axis is measured and a second display showing a second variation of the ion current is carried out in real time (step S230).

Thereafter, a second maximum value of the ion current is detected based on the second variation, and a second inclination angle of the ion beam is calculated from a second rotation angle of the Faraday cup assembly rotated about the vertical axis corresponding to the second maximum value (step S240). Here, the second maximum value can be simultaneously detected when measuring the second variation of the ion current.

If the first and second maximum values of the ion current are simultaneously detected when measuring the first and second variations of the ion current, the time for measuring the inclination angle of the ion beam is shortened.

In addition, in case a third maximum value of the ion current is detected by rotating the Faraday cup assembly about the horizontal axis in a state that the first rotation angle of the Faraday cup assembly, in which the first maximum value of the ion current has been detected, is maintained, the amount of ions comprising the ion beam can be precisely calculated from the third maximum value of the ion current. That is, when the third maximum value of the ion current is detected, the Faraday cup assembly is arranged in parallel with the ion beam so that the amount of ions comprising the ion beam can be precisely calculated. Accordingly, the amount of ions implanted into a wafer can be precisely adjusted.

Figure 3:
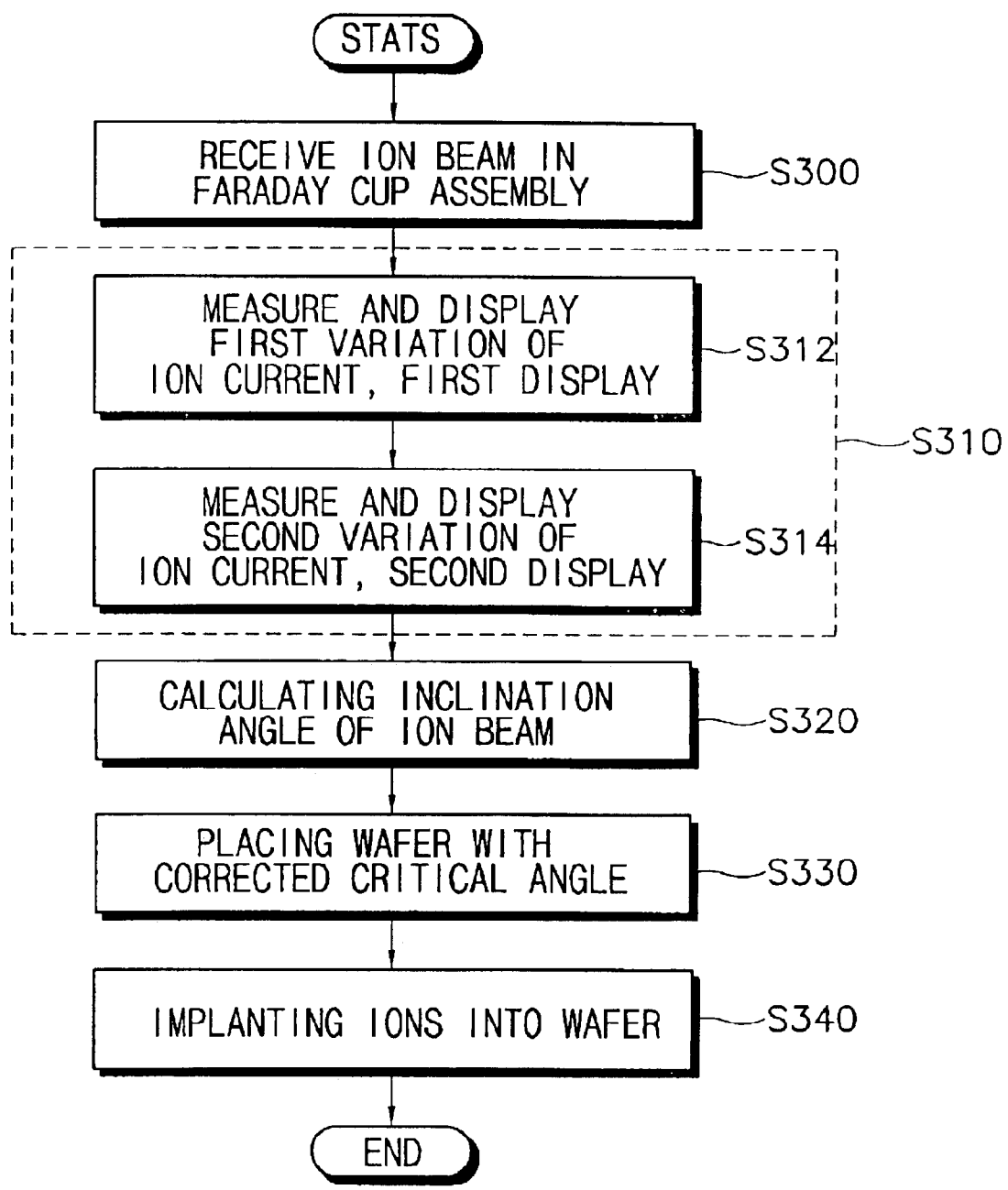
FIG. 3 is a flow chart showing a method for implanting ions according to a third embodiment.

FIG. 3 is a flow chart showing a method for implanting ions according to a third embodiment.

Referring to FIG. 3, the Faraday cup assembly for receiving the ion beam is positioned in the advancing path of the ion beam supplied from an ion source and the ion current of the ion beam is measured from the Faraday cup assembly (step S300). The ion beam may be a spot ion beam or a ribbon ion beam. The Faraday cup assembly is positioned in line with the central axis of the ion source. In this embodiment, the parts identical to the parts of the first and second embodiments will not be further explained below to avoid the redundancy.

Then, the variation of the ion beam is measured while varying the angle of the ion beam received in the Faraday cup assembly (step S310).

In detail, the Faraday cup assembly is rotated about the horizontal axis, which vertically crosses with a vertical plane including the central axis of the ion source and passes through the Faraday cup assembly. Then, a first variation of the ion current varied according to a first rotation of the Faraday cup assembly about the horizontal axis is measured (step S312).

Thereafter, the Faraday cup assembly is rotated about the vertical axis which passes through a cross point of the central axis and the horizontal axis of the ion source. Then, a second variation of the ion current according to a second rotation of the Faraday cup assembly about the vertical axis is measured (step S314).

In steps S312 and S314, the ion current is measured as an ion voltage by an electric circuit connected to the Faraday cup assembly and a first display showing the first variation of the ion current and a second display showing the second variation of the ion current are carried out in real time.

Then, a first maximum value of the ion current is detected based on the first variation of the ion current and a second maximum value of the ion current is detected based on the second variation of the ion current. In addition, an inclination angle of the ion beam is obtained based on first and second rotation angles of the Faraday cup assembly corresponding to the first and second maximum values of the ion current step S320.

When the inclination angle of the ion beam has been calculated, the Faraday cup assembly is removed from the advancing path of the ion beam and a wafer is placed in the advancing path of the ion beam (step S330). Here, the wafer is fixed to an electrostatic chuck by an electrostatic force of the electrostatic chuck and has a critical angle corrected according to the inclination angle of the ion beam. For example, if the wafer has an inclination angle of 7° with respect to a vertical plane when the ion beam is horizontally supplied, that is if the incident angle of the ion beam is 83°, the following occurs. If the inclination angle of the wafer is not corrected to account for the fact that the ion beam has a predetermined inclination angle, the ion beam cannot be incident on the wafer at an incident angle of 83°. Accordingly, the wafer has to be arranged to have a corrected inclination angle, based on a measured inclination angle of the ion beam. That is, the inclination angle of the wafer has to be corrected such that the ion beam has the incident angle of 83°, based on the predetermined inclination angle of 7° and the measured inclination angle of the ion beam.

Then, the wafer is moved for implanting ions of the ion beam on the whole area of the wafer (step S340). At this time, if the ion beam is a spot beam, the electrostatic chuck moves up and down while rotating the wafer. If the ion beam is a ribbon beam, the electrostatic chuck moves up and down so as to implant the ions on the whole area of the wafer and rotates the wafer step by step so as to prevent the shadow effect caused by a pattern. For example, the electrostatic chuck drives the wafer up and down so as to primarily implant ions onto the wafer. Then, after rotating the wafer at an angle of 90°, the electrostatic chuck again drives the wafer up and down so as to implant ions onto the wafer. By rotating and driving the wafer up and down step by step, the shadow effect can be prevented.

Accordingly, by arranging the wafer to have the corrected critical angle based on the inclination angle of the ion beam, the channeling effect and the shadow effect can be effectively prevented and the amount of ions implanted into the wafer can be precisely adjusted.

Figure 4:
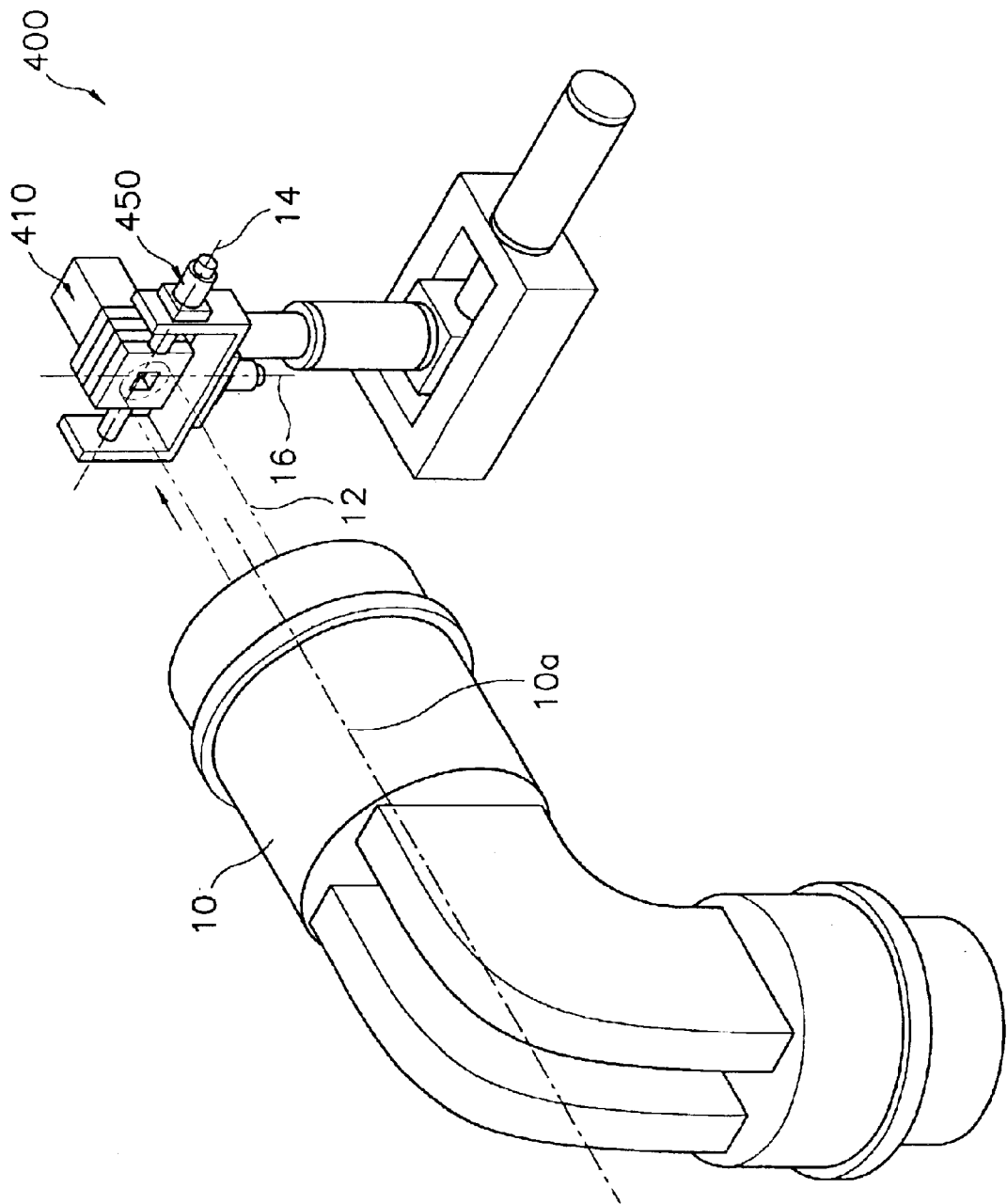
FIG. 4 is a schematic view of a first embodiment of an apparatus for measuring an inclination angle of an ion beam.
Figure 5:
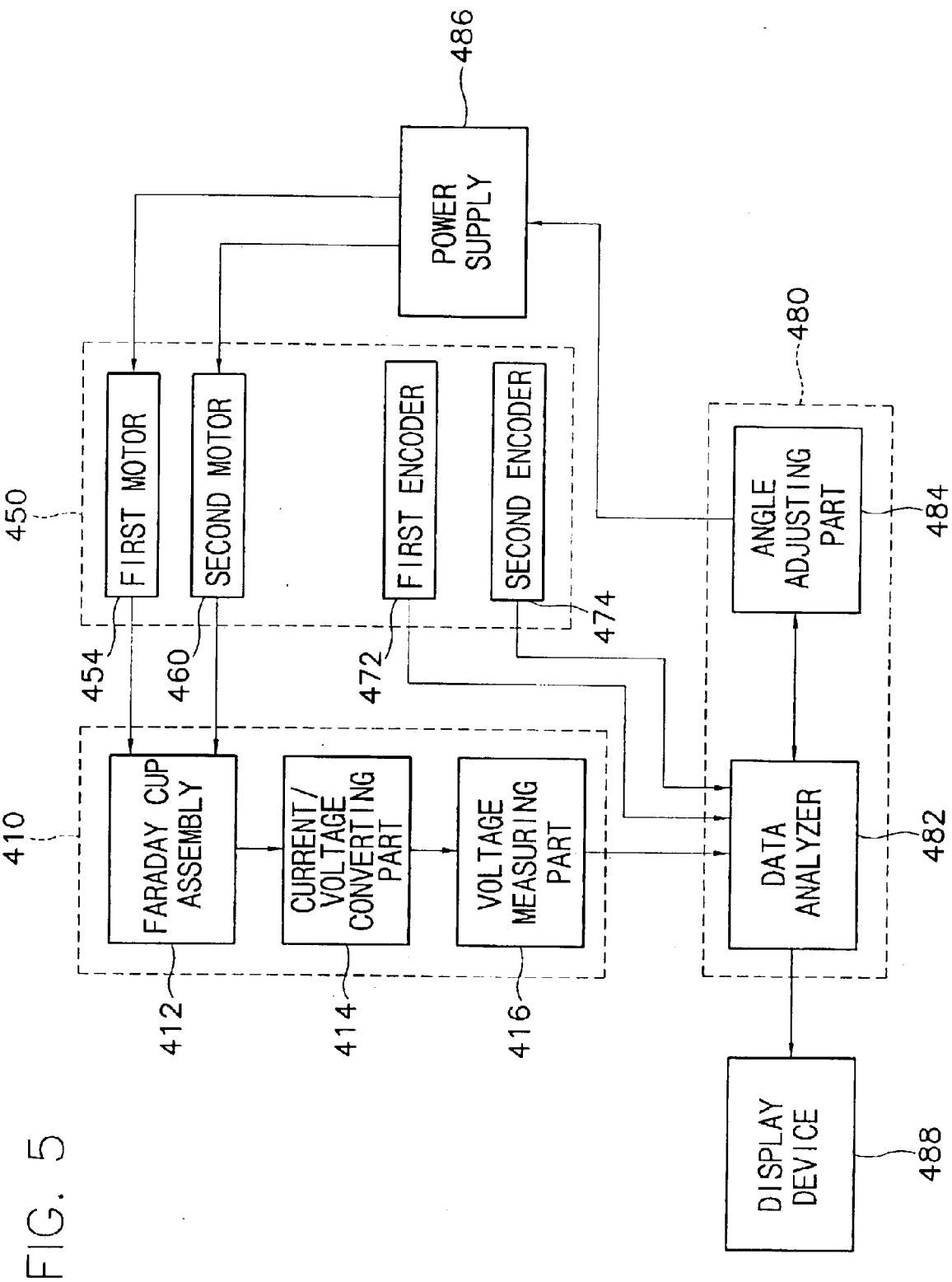
FIG. 5 is a block diagram of the apparatus of FIG. 4.

FIG. 4 is a schematic view of a first embodiment of an apparatus for measuring the inclination angle of the ion beam, and FIG. 5 is a block diagram of the apparatus of FIG. 4.

Referring to FIGS. 4 and 5, an ion source 10 generates source gas in a plasma state and provides an ion beam by extracting predetermined ions from the plasma state source gas. The ion beam as shown is a spot ion beam 12 having a circular cross-sectional area and the ion source 10 is arranged such that a central axis thereof is horizontally positioned. An apparatus 400 for measuring the inclination angle of the ion beam includes: an ion current measuring section 410 provided at one side of the ion source 10 so as to measure the ion current of the spot ion beam 12; an angle varying section 450 connected to the ion current measuring section 410 so as to vary an alignment angle of the ion current measuring section 410; and an inclination angle calculating section 480 connected to the ion current measuring section 410 and the angle varying section 450 so as to calculate the inclination angle of the spot ion beam 12.

The ion current measuring section 410 includes: a Faraday cup assembly 412 for receiving the spot ion beam 12 supplied from the ion source 10; a current/voltage converting part 414 connected to the Faraday cup assembly 412 so as to convert the ion current generated from the Faraday cup assembly 412 into an ion voltage; and a voltage measuring part 416 connected to the current/voltage converting part 414 in order to measure the converted ion voltage.

The angle varying section 450 includes: a first motor 454 for rotating the Faraday cup assembly 412 about a horizontal axis 14, which is vertically crossed with a vertical plane including a central axis 10a of the ion source 10 and passes through the Faraday cup assembly 412; a first encoder 472 for measuring a first rotation angle of the first motor 454; a second motor 460 for rotating the Faraday cup assembly 412 about a vertical axis 16, which passes through an intersection of the central axis 10a of the ion source 10 and the horizontal axis 14; and a second encoder 474 for measuring a second rotation angle of the second motor 460.

The inclination angle calculating section 480 includes a data analyzer 482 and an angle control part 484. The data analyzer 482 analyzes the first and second variations of the ion current according to the first and second rotations of the Faraday cup assembly 412 so as to detect the first and second maximum values of the ion current, and calculates the first and second inclination angles of the spot ion beam 12 based on the first and second rotation angles of the Faraday cup assembly 412 corresponding to the detected first and second maximum values of the ion current. The angle control part 484 adjusts the align angle of the Faraday cup assembly 412 by controlling the operation of the first and second motors 454 and 460 rotating the Faraday cup assembly 412. In addition, a power supply 486 is connected to the angle control part 484 so as to supply power to the first and second motors 454 and 460, and a display device 488 is connected to the data analyzer 482 in order to display the first and second variations of the ion current.

Figure 6:
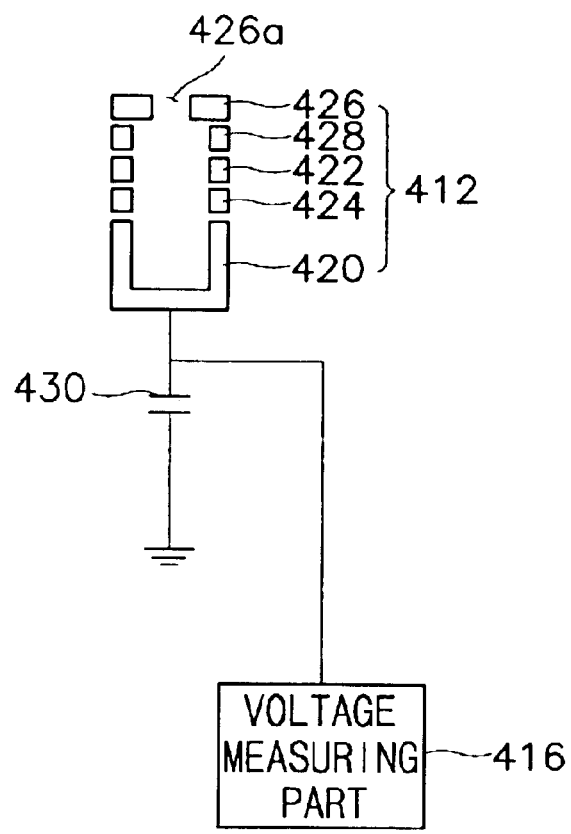
FIG. 6 is a view showing an embodiment of an ion current measuring part of the apparatus of FIG. 4 for measuring an inclination angle of an ion beam shown in FIG. 4.
Figure 7:
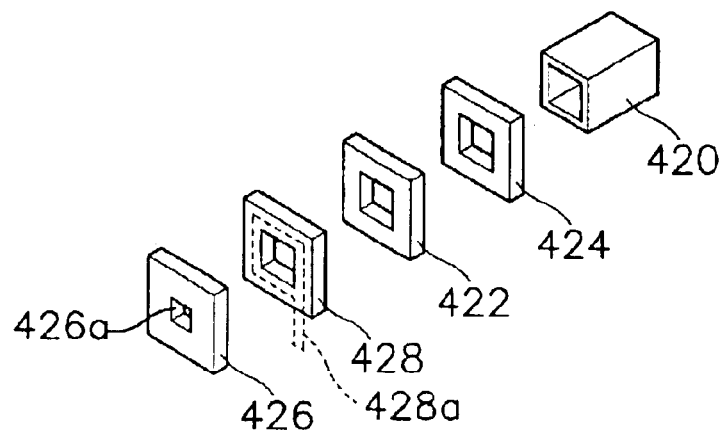
FIG. 7 is an exploded perspective view of a Faraday cup assembly shown in FIG. 6.

FIG. 6 is a view showing an embodiment of the ion current measuring section 410 of the apparatus of FIG. 4 for measuring the inclination angle of the ion beam shown in FIG. 4, and FIG. 7 is an exploded perspective view of the Faraday cup assembly shown in FIG. 6.

Referring to FIGS. 6 and 7, the Faraday cup assembly 412 is arranged in opposition to the ion source 10 and receives the spot ion beam 12 supplied from the ion source 10. The Faraday cup assembly 412 includes: a Faraday cup 420 for receiving the spot ion beam 12; a bias ring 422 provided at an inlet of the Faraday cup 420; and connected to a bias power for restraining the secondary electrons generated by the spot ion beam 12 received in the Faraday cup 420; an insulation ring 424 provided between the Faraday cup 420 and the bias ring 422; a cover 426 provided at one side of the bias ring 422 and formed with an opening 426a through which the spot ion beam 12 passes; and a cooling ring 428 provided between the cover 426 and the bias ring 422 so as to receive cooling wafer for preventing the temperature from being raised by the spot ion beam 12. The opening 426a of the cover 426 has a size smaller than a sectional area of the spot ion beam 12, and the cover 426 includes graphite for allowing ions, except for ions received in the Faraday cup 420 through the opening 426a, to be easily implanted. The cooling ring 428 is formed at an inner portion thereof with a passage 428a for guiding cooling water. Cooling water includes deionized water.

The current/voltage converting part 414 includes a capacitor 430 connected to the Faraday cup 420, and the ion current generated from the Faraday cup 420 is stored in the capacitor 430. The capacitor 430 is connected to the voltage measuring part 416, which measures the voltage of the capacitor 430. The measured ion voltage is transferred to the data analyzer 482. The ion current can be directly measured by using an ampere meter.

Figure 8:
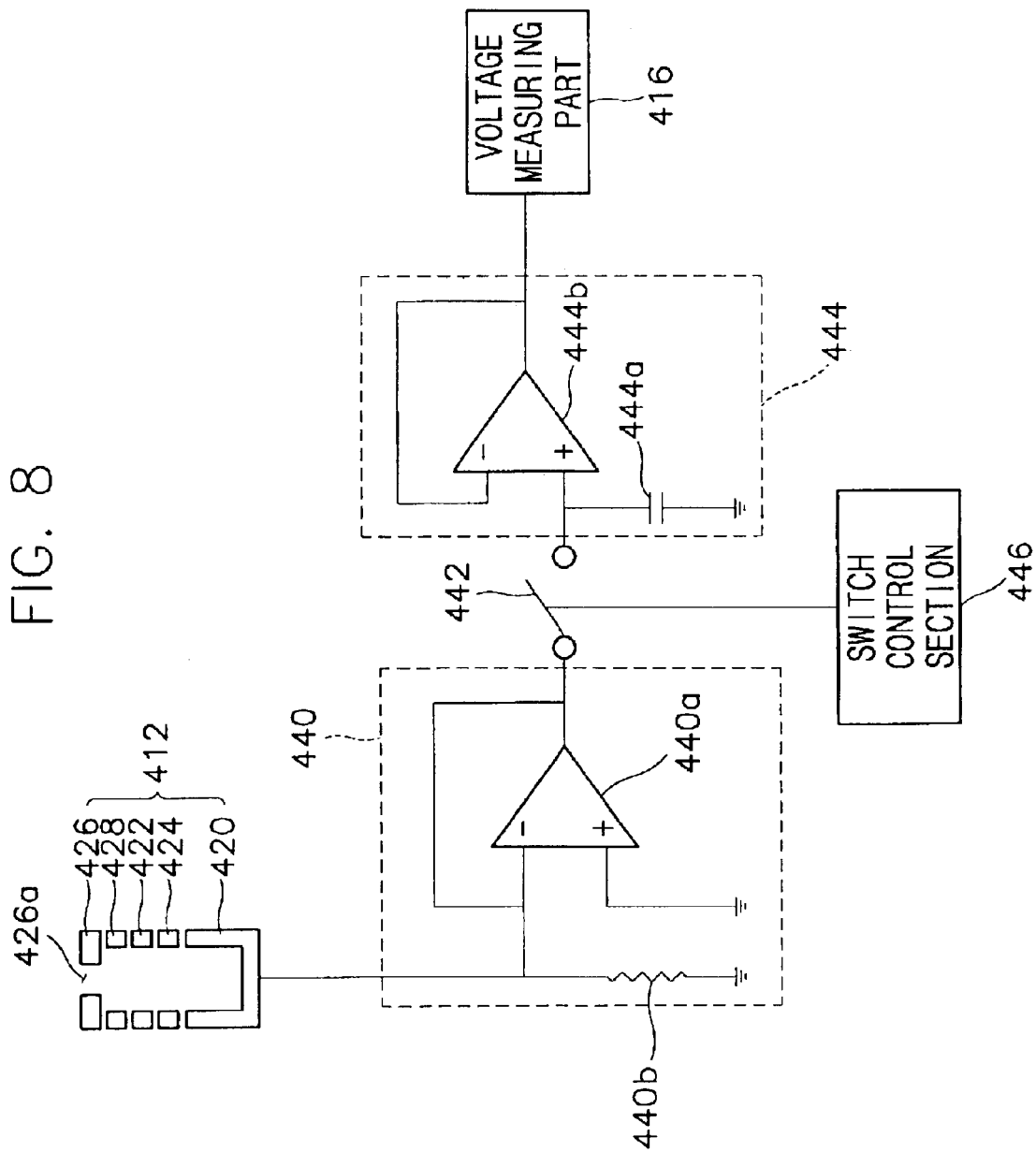
FIG. 8 is a view showing another embodiment of a current/voltage converting part of the apparatus of FIG. 4 for measuring an inclination angle of an ion beam shown in FIG. 4.

FIG. 8 is a view showing another embodiment of the current/voltage converting part of the apparatus of FIG. 4 for measuring the inclination angle of the ion beam shown in FIG. 4.

Referring to FIG. 8, the current/voltage converting part 414 includes a sample & hold circuit. The Faraday cup 420 is connected to an amplifier 440 including an operation amplifier 440a and a resistor 440b. The amplifier 440 is connected through a switch 442 to a buffer 444, including a capacitor 444a for storing the ion current and an operational amplifier 444b. The buffer 444 constantly maintains the ion voltage of the capacitor 444a and sends the ion voltage to the voltage measuring part 416. A switch control section 446 is connected to the switch 442 so as to control the opening/closing time of the switch 442. The switch 442 operated by the switch control section 446 connects the amplifier 440 to the buffer 444 for one second, and the ion voltage of the ion beam is measured in the voltage measuring part 416 through the buffer 444. The measured ion voltage is transferred to the data analyzer 482 of the ion beam inclination angle calculating section 480.

Figure 9:
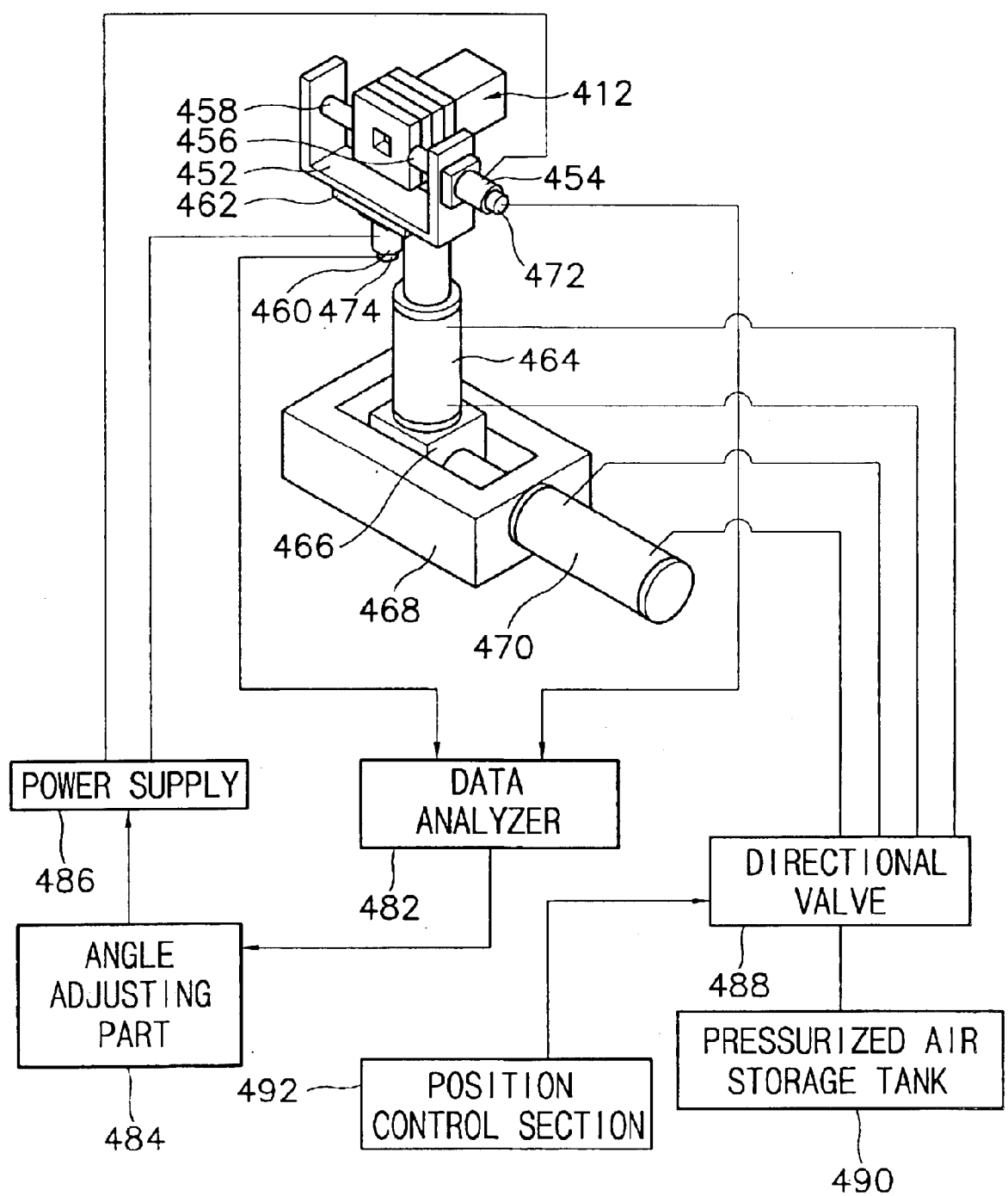
FIG. 9 is a view showing an angle varying section of the apparatus for measuring an inclination angle of an ion beam shown in FIG. 4.

FIG. 9 is a view showing the angle varying section of the apparatus for measuring the inclination angle of the ion beam shown in FIG. 4.

Referring to FIG. 9, a bracket 452 for supporting the Faraday cup assembly 412 is provided at a lower portion of the Faraday cup assembly 412. Both ends of the bracket 452 are bent and upwardly extend towards both sides of the Faraday cup assembly 412. One end of the bracket 452 is connected to the Faraday cup assembly 412 through a first driving shaft 456 connected to the first motor 454, and the other end of the bracket 452 is connected to the Faraday cup assembly 412 through a first rotating shaft 458. Here, the first driving shaft 456 and the first rotating shaft 458 are positioned in a line, which horizontally passes through a central part of the opening 426a formed in the cover 426.

A second driving shaft (not shown) connected to the second motor 460 is coupled to a lower portion of the bracket 452. The second driving shaft passes through a base plate 462, the bracket 452 is placed at an upper portion of the base plate 462, and the second motor 460 is fixed to a lower portion of the base plate 462. Here, the second driving shaft is positioned in a line which vertically passes through a central part of the opening 426a formed in the cover 426.

In addition, a first pneumatic cylinder 464 is connected to the lower portion of the base plate 462 so as to adjust the vertical position of the Faraday cup assembly 412. The first pneumatic cylinder 464 is fixed to a moving block 466. The moving block 466 is installed in a linear motion guide 468. The linear motion guide 468 is vertically installed with respect to the central axis 10a of the ion source 10, and a second pneumatic cylinder 470 is installed at one side of the linear motion guide 468 in order to linearly reciprocate the moving block 466. Referring to FIG. 9, the apparatus 400 for measuring the inclination angle of the ion beam includes the first and second pneumatic cylinders 464 and 470 for moving the base plate 462. However, it is also possible to use a ball-screw type linear motion member or a linear motor.

First and second encoders 472 and 474 are respectively installed at one end of each of first and second motors 454 and 460 so as to measure the rotation angles of the first and second motors 454 and 460. The first and second encoders 472 and 474 are connected to the data analyzer 482 of the inclination angle calculating section 480, and the first and second motors 454 and 460 are connected to the angle control part 484 of the inclination angle calculating section 480 through the power supply 486. The first and second pneumatic cylinders 464 and 470 are connected to a directional valve 488 and a pressurized air storage tank 490. The directional valve 488 is connected to a position control section 492 for controlling the operation of the first and second pneumatic cylinders 464 and 470. The directional valve 488 includes a solenoid valve.

Hereinafter, the operation of the apparatus for measuring the inclination angle of the ion beam will be described.

First, the first pneumatic cylinder 464 is expanded according to a control signal of the position control section 492, so the Faraday cup assembly 412 is arranged such that the central axis of the Faraday cup assembly 412 is matched with the central axis 10a of the ion source 10. At this time, the central axis of the first driving shaft 456 and the first rotating shaft 458 connected to the first motor 454 is vertically crossed with the central axis 10a of ion source 10.

Then, the spot ion beam 10 supplied from the ion source 10 is received in the Faraday cup 420. The ion current generated from the spot ion beam 12 received in the Faraday cup 420 is converted into the ion voltage by the current/voltage converting part 414 and measured by the voltage measuring part 416.

Thereafter, the Faraday cup assembly 412 is rotated clockwise by an angle of 0.1° by the first motor 454 operated according to the control signal of the angle control part 484. Then, the voltage measuring part 416 sends the ion voltage measured by the current/voltage converting part 414 to the data analyzer 482. Here, the switch control section 446 sets the switch opening time to a predetermined time.

The above measuring process is repeatedly carried out while varying the angle of the Faraday cup assembly 412 to a predetermined angle. The first variation of the ion current is measured through the voltage measuring part 416 and transferred to the data analyzer 482.

Then, the Faraday cup assembly 412 is rotated counter-clockwise by the first motor 454 so that the Faraday cup assembly 412 is returned to its initial position. In this state, the Faraday cup assembly 412 is counterclockwise rotated by an angle of 0.1°. At this time, the first variation of the ion current is measured by the voltage measuring part 416 and transferred to the data analyzer 482.

After measuring the first variation of the ion current in the counterclockwise direction of the Faraday cup assembly, the first motor 454 rotates the Faraday cup assembly 412 clockwise so that the Faraday cup assembly returns to its initial position.

The first variation of the ion current measured through the above process is stored in the data analyzer 482, and the data analyzer 482 detects the first maximum value of the ion current from the first variation of the ion current.

Then, the second motor 460 rotates the Faraday cup assembly 412 clockwise by an angle of 0.1°, and the ion current measuring section 410 transfers the ion current generated from the Faraday cup assembly 412 to the data analyzer 482 by converting the ion current into the ion voltage.

Similar to the measurement of the first variation of the ion current, the second variation of the ion current is measured and the measured second variation of the ion current is stored in the data analyzer 482.

Then, the data analyzer 482 detects the second maximum valve of the ion current from the second variation of the ion current.

While measuring the ion current, the first and second rotation angles of the first and second motors 454 and 460 are measured by the first and second encoders 472 and 474 and transferred to the data analyzer 482. The data analyzer 482 calculates the first and second inclination angles of the spot ion beam 12 based on the first rotation angle of the first motor 454 corresponding to the first maximum value of the ion current and the second rotation angle of the second motor 454 corresponding to the second maximum value of the ion current. At this time, the first and second variations of the ion current and the first and second rotation angles of the first and second motors 454 and 460 are displayed in the display device 488.

When measuring the ion current of the spot ion beam 12, the first and second variations of the ion current are respectively measured and the first and second maximum values of the ion current are detected based on the first and second variations of the ion current. However, it is also possible to simultaneously detect the first maximum value when measuring the first variation of the ion current and the second maximum value when measuring the second variation of the ion current. In this case, the measuring time can be shortened, however, the whole variation of the ion current cannot be checked.

In addition, though the above measuring process returns the Faraday cup assembly to its initial position to measure the second variation of the ion current, it is also possible to measure a third variation of the ion current from the Faraday cup assembly 412 rotated by the second motor 460, while maintaining the first rotation angle through which the first maximum value of the ion current is detected. At this time, the amount of the ions included in the spot ion beam 12 can be precisely measured from the third maximum value of the ion current, which is detected based on the third variation of the ion current. That is, when the third maximum value of the ion current is detected, the Faraday cup assembly 412 is arranged in parallel with the advancing direction of the spot ion beam 12, so the amount of the ions included in the spot ion beam 12 is calculated from the third maximum value of the ion current. Accordingly, the first and second inclination angles of the spot ion beam and the amount of the ions forming the spot ion beam 12 can be simultaneously measured, so the amount of the ions implanted into the wafer and the incident angle of the ion beam 12 incident into the wafer can be precisely adjusted.

Figure 10:
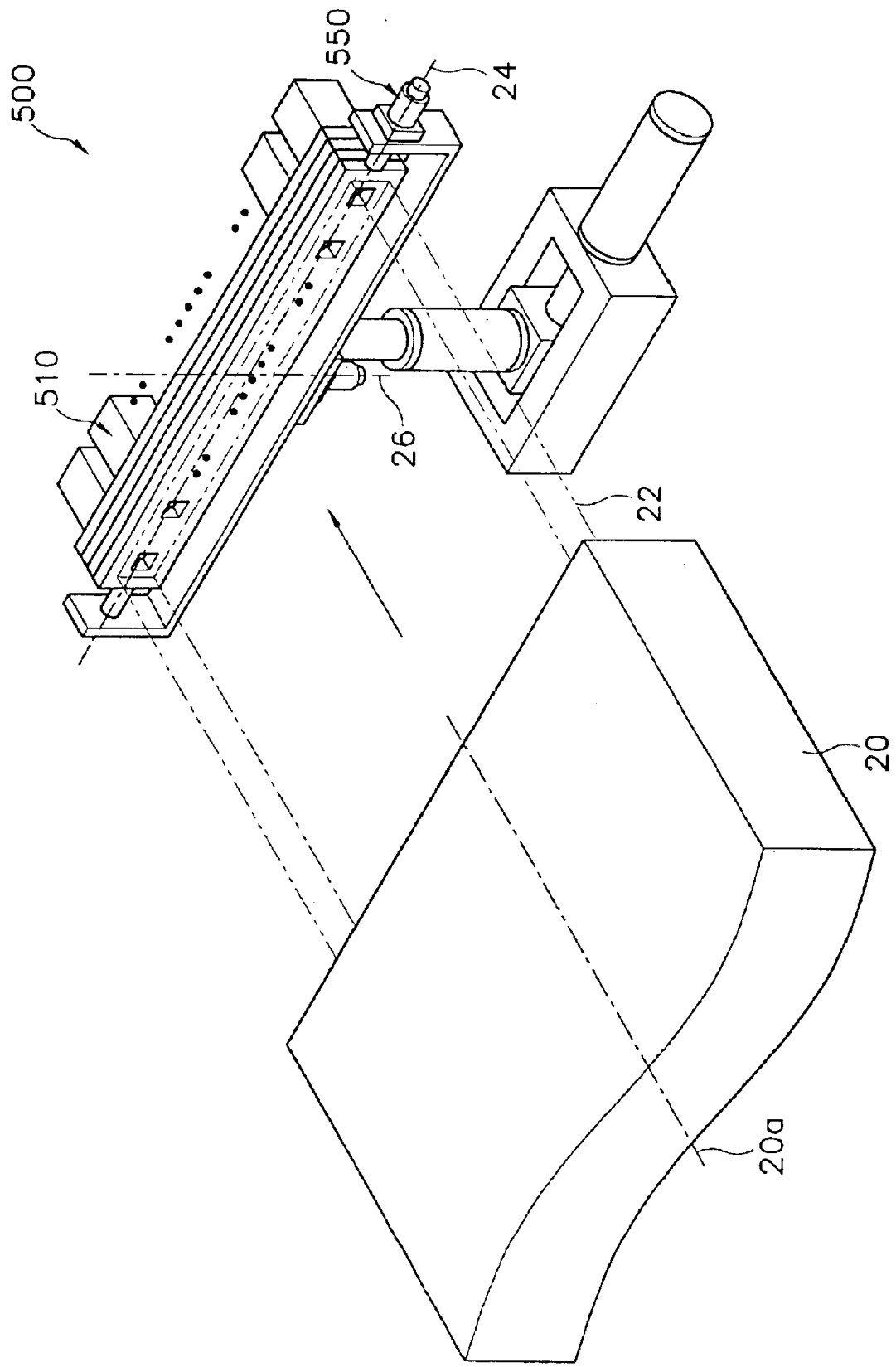
FIG. 10 is a schematic view of a second embodiment of an apparatus for measuring an inclination angle of an ion beam.
Figure 11:
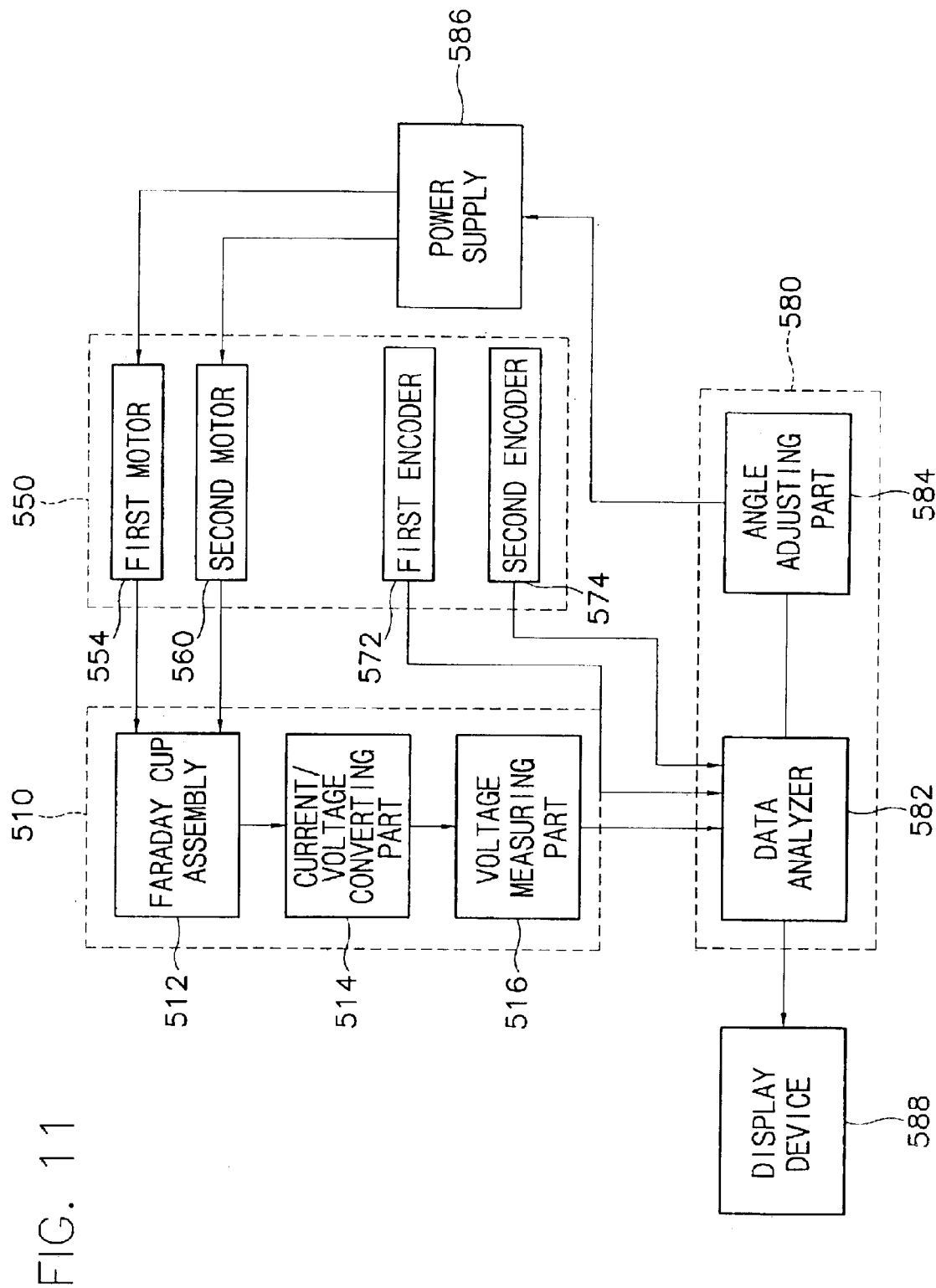
FIG. 11 is a block diagram of the apparatus of FIG. 10.

FIG. 10 is a schematic view of a second embodiment of an apparatus for measuring an inclination angle of an ion beam, and FIG. 11 is a block diagram of the apparatus of FIG. 10.

Referring to FIGS. 10 and 11, an ion source 20 is positioned such that a central axis 20a thereof is horizontally arranged, and an ion beam supplied from the ion source 20 has a ribbon shape having a width in a horizontal direction thereof. Hereinafter, the ion beam having the ribbon shape is referred to as a ribbon ion beam 22. The apparatus 500 for measuring the inclination angle of the ion beam includes an ion current measuring section 510 provided at one side of the ion source 20 so as to measure the ion current of the ribbon ion beam 22, an angle varying section 550 connected to the ion current measuring section 510 so as to vary an alignment angle of the ion current measuring section 510, and an inclination angle calculating section 580 connected to the ion current measuring section 510 and the angle varying section 550 so as to calculate the inclination angle of the ribbon ion beam 22. The parts identical to the parts of the first embodiment will not be further explained again below to avoid redundancy.

Figure 12:
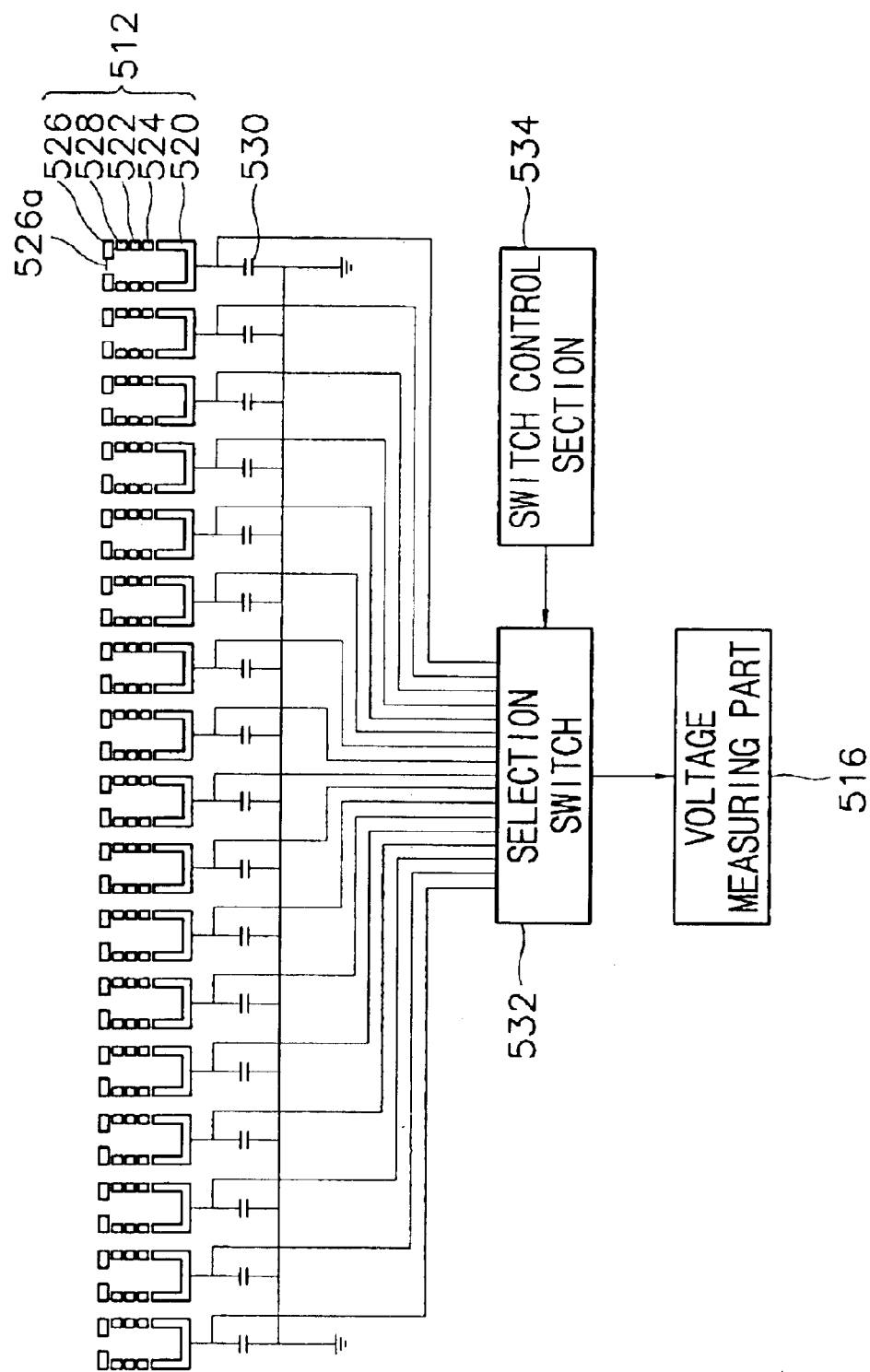
FIG. 12 is a view showing an ion current measuring section of the apparatus for measuring an inclination angle of an ion beam shown in FIG. 10.
Figure 13:
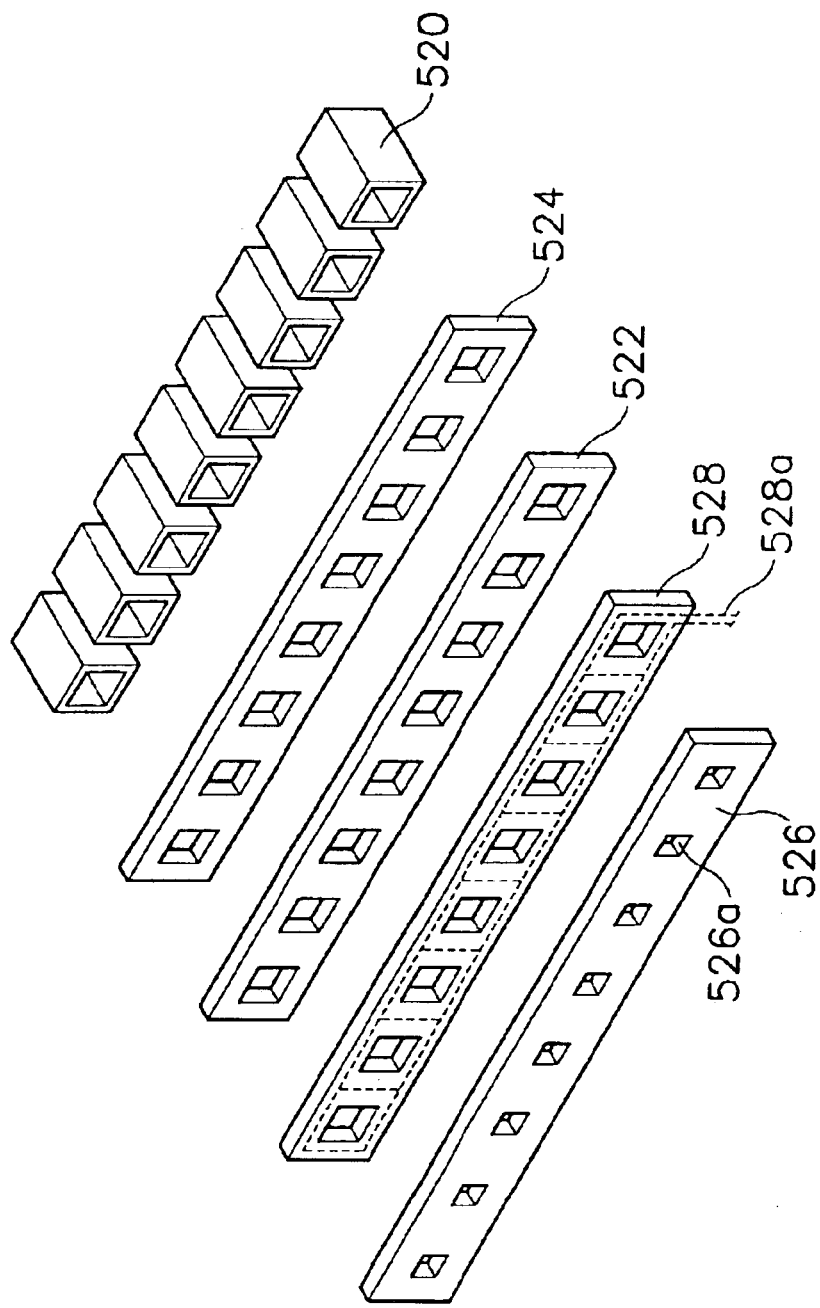
FIG. 13 is an exploded perspective view of a Faraday cup assembly shown in FIG. 12.

FIG. 12 is a view showing the ion current measuring section of the apparatus for measuring the inclination angle of the ion beam shown in FIG. 10, and FIG. 13 is an exploded perspective view of a Faraday cup assembly as shown in FIG. 12.

Referring to FIGS. 12 and 13, the ion current measuring section 510 includes the Faraday cup assembly 512 for receiving the ribbon ion beam 22 supplied from the ion source 20, a current/voltage converting part 514 connected to the Faraday cup assembly 512 so as to convert the ion current generated from the Faraday cup assembly 512 into an ion voltage, and a voltage measuring part 516 connected to the current/voltage converting part 514 in order to measure the converted ion voltage.

The Faraday cup assembly 512 is arranged in opposition to the ion source 20 and receives the ribbon ion beam 22 supplied from the ion source 20. The Faraday cup assembly 512 includes: a plurality of Faraday cups 520 for receiving the ribbon ion beam 22; a bias plate 522 provided at inlets of the Faraday cups 420 and connected to a bias power for restraining the secondary electrons generated by the ribbon ion beam 22 received in the Faraday cups 520; an insulation plate 524 provided between the Faraday cups 520 and the bias plate 522; a cover 526 provided at one side of the bias plate 522 and formed with a plurality of openings 526a through which the ribbon ion beam 22 passes; and a cooling plate 528 provided between the cover 526 and the bias plate 522 so as to receive cooling wafer for preventing the temperature from being raised caused by the ribbon ion beam 22. The Faraday cups 520 are connected to each other in a row in a horizontal direction vertical to the central axis 20a of the ion source 20. The openings 526a formed in the cover 526 are corresponding to the Faraday cups 520 and have a height smaller than a thickness of the ribbon ion beam 22. In addition, the cover 526 includes graphite for allowing ions, except for ions received in the Faraday cups 520 through the opening 526a, to be easily implanted. A plurality of openings corresponding to the Faraday cups 520 are formed in the bias plate 522, the insulation plate 524 and the cooling plate 528. The cooling plate 528 is formed at an inner portion thereof with a passage 528a for guiding cooling water. Cooling water includes deionized water. According to the second embodiment, seventeen Faraday cups 520 are used. However, the number of Faraday cups 520 can be varied depending on the size of the wafer and the width of the ribbon ion beam 22.

The current/voltage converting part 514 includes a plurality of capacitors 530 connected to the Faraday cups 520 and a selection switch 532 for selectively or sequentially connecting the voltage measuring part 516 to the capacitors 530, to measure the voltage of the capacitors 530. In addition, a switch control section 534 is connected to the selection switch 532 for controlling the connection order and connection time. The ion current generated from the Faraday cups 520 is stored in the capacitors 530 and connected to the voltage measuring part 516 through the selection switch 532. The voltage measuring part 516 sends the measured ion voltage to a data analyzer 582 of the inclination angle calculating section 580. The ion current generated from the Faraday cups 520 can be directly measured by using an ampere meter.

Figure 14:
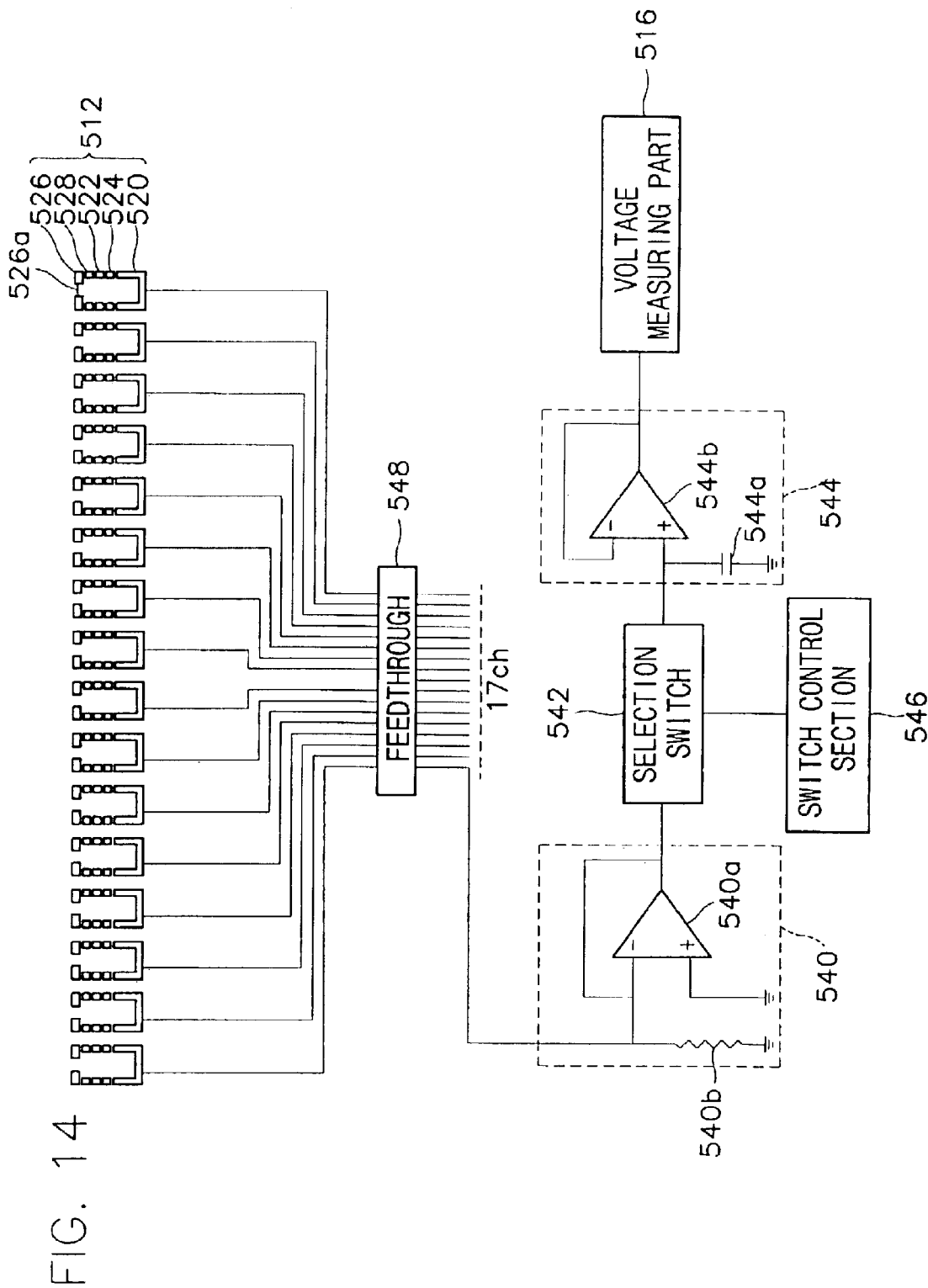
FIG. 14 is a view showing another embodiment of a current/voltage converting part of the apparatus for measuring an inclination angle of an ion beam shown in FIG. 10.

FIG. 14 is a view showing another embodiment of the current/voltage converting part of the apparatus for measuring the inclination angle of the ion beam shown in FIG. 10.

Referring to FIG. 14, the current/voltage converting part 514 includes a well-known sample & hold circuit. The Faraday cups 520 are connected through a feedthrough 548 to a plurality of amplifiers 540, each including an operation amplifier 540a and a resistor 540b. The amplifiers 540 are connected through a selection switch 542 to a plurality of buffers 544, each buffer including a capacitor 544a for storing the ion current, and an operational amplifier 544b. The buffers 544 constantly maintain the ion voltage of the capacitors 544a and send the ion voltage to the voltage measuring part 516. The selection switch 542 selectively or sequentially connects the amplifiers 540 to the buffers 544 in a predetermined time period. A switch control section 546 is connected to the selection switch 542 to control the connection state and the opening/closing time of the selection switch 542. The ion voltage measured by the voltage measuring part 516 is transferred to the data analyzer 582 of the ion beam inclination angle calculating section 580.

Figure 15:
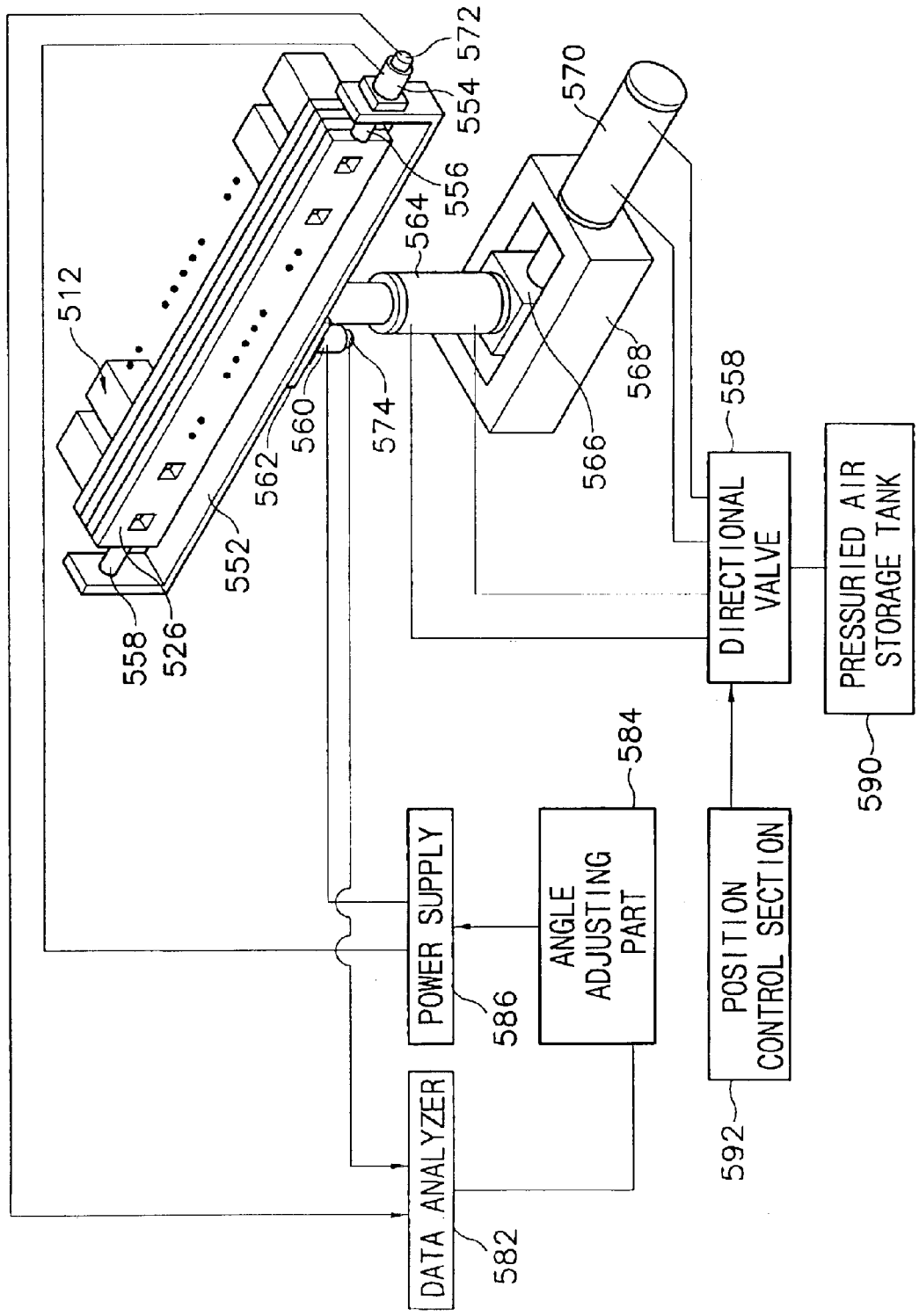
FIG. 15 is a view showing an angle varying section of the apparatus for measuring an inclination angle of an ion beam shown in FIG. 10.

FIG. 15 is a view showing the angle varying section of the apparatus for measuring the inclination angle of the ion beam shown in FIG. 10.

Referring to FIG. 15, a bracket 552 for supporting the Faraday cup assembly 512 is provided at a lower portion of the Faraday cup assembly 512. Both ends of the bracket 552 are bent and upwardly extend towards both sides of the Faraday cup assembly 512. One end of the bracket 552 is connected to the Faraday cup assembly 512 through a first driving shaft 556 connected to a first motor 554, and the other end of the bracket 552 is connected to the Faraday cup assembly 512 through a first rotating shaft 558. At this time, the first driving shaft 556 and the first rotating shaft 558 are positioned in a line, which horizontally passes through a central part of the cover 526 of the Faraday cup assembly 512.

A second driving shaft (not shown) connected to a second motor 560 is coupled to a lower portion of the bracket 552. The second driving shaft passes through a base plate 562, the bracket 552 is placed at an upper portion of the base plate 562, and the second motor 560 is fixed to a lower portion of the base plate 562. At this time, the second driving shaft is positioned in a line, which vertically passes through a central part of the cover 526.

In addition, a first pneumatic cylinder 564 is connected to the lower portion of the base plate 562 so as to adjust the vertical position of the Faraday cup assembly 512. The first pneumatic cylinder 564 is fixed to a moving block 566. The moving block 566 is installed in a linear motion guide 568. The linear motion guide 568 is vertically installed with respect to the central axis 20a of the ion source 20, and a second pneumatic cylinder 570 is installed at one side of the linear motion guide 568 in order to linearly reciprocate the moving block 566.

First and second encoders 572 and 574 are respectively installed at one end of each of the first and second motors 554 and 560 so as to measure the rotation angles of the first and second motors 554 and 560. The first and second encoders 572 and 574 are connected to the data analyzer 582 of the inclination angle calculating section 580, and the first and second motors 554 and 560 are connected to an angle control part 584 of the inclination angle calculating section 580 through a power supply 586. The first and second pneumatic cylinders 564 and 570 are connected to a directional valve 588 and a pressurized air storage tank 590. The directional valve 588 is connected to a position control section 592 for controlling the operation of the first and second pneumatic cylinders 564 and 570. The directional valve 588 includes a solenoid valve.

The operation of the ion beam inclination angle measuring apparatus 500 according to the fifth embodiment of the present invention is similar to the operation of the ion beam inclination angle measuring apparatus 400 according to the fourth embodiment of the present invention. In this embodiment, however, the plural ion voltage measuring values are stored in the data analyzer 582, and the plural first and second maximum values are detected from the plural Faraday cups 520. Accordingly, the distribution of the ribbon ion beam 22 in a width direction thereof can be measured.

Figure 16:
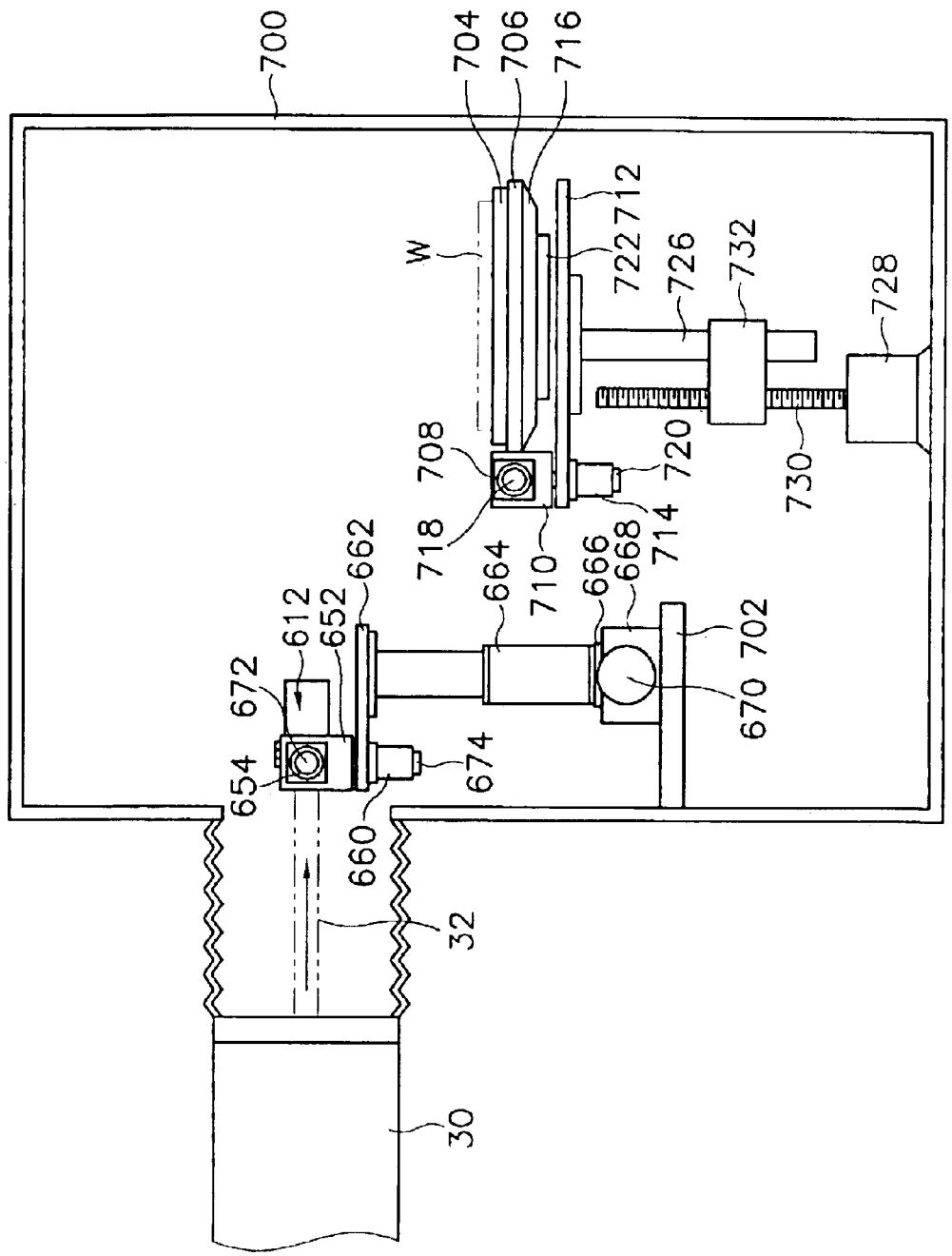
FIG. 16 is a schematic view of a third embodiment of an apparatus for measuring an inclination angle of an ion beam.
Figure 17:
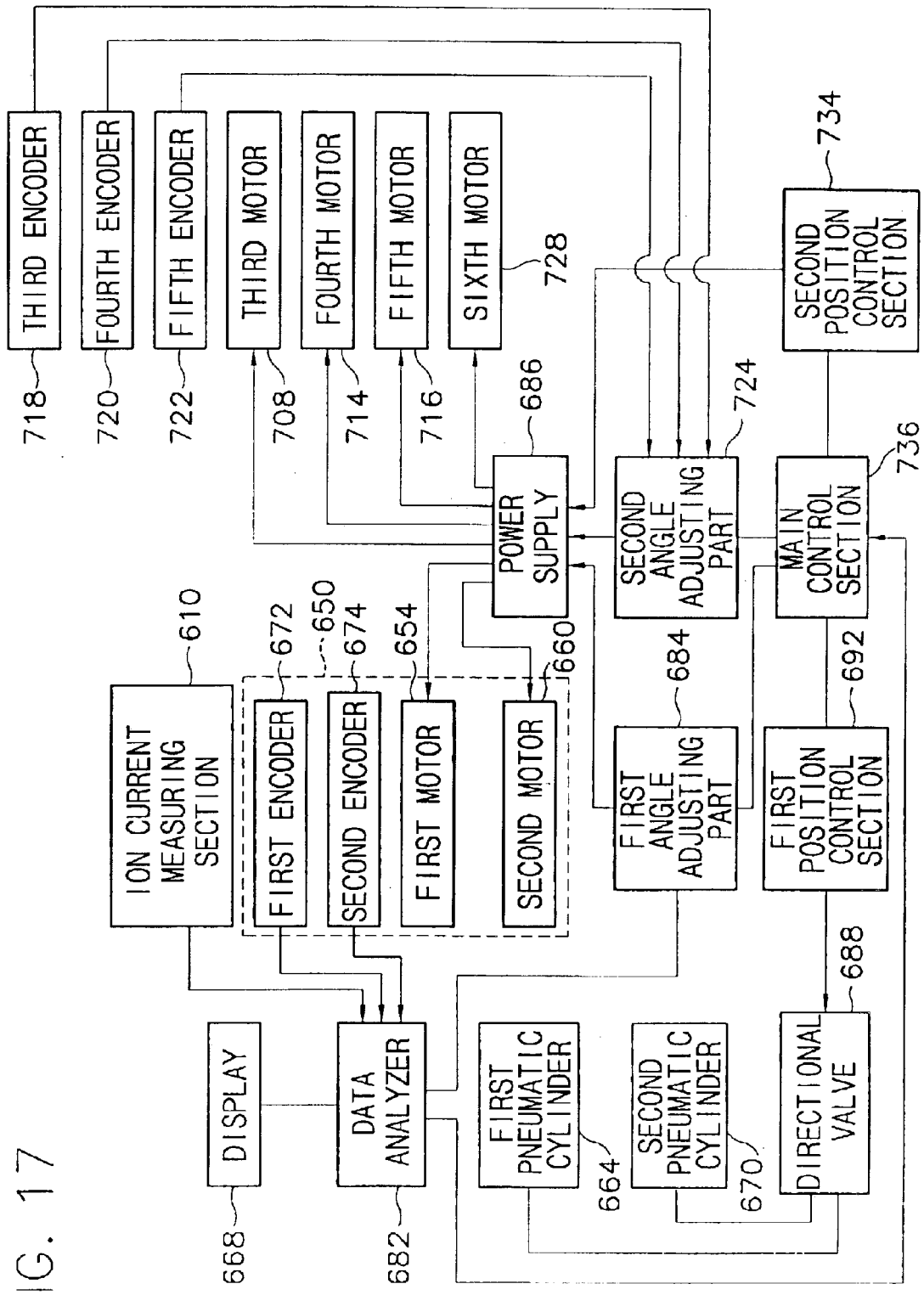
FIG. 17 is a block diagram of the apparatus of FIG. 16.

FIG. 16 is a schematic view of a third embodiment of an apparatus for measuring the inclination angle of the ion beam, and FIG. 17 is block diagram of the apparatus of FIG. 16.

Referring to FIGS. 16 and 17, an ion source 30 for supplying a ribbon ion beam 32 is horizontally connected to an ion implantation chamber 700, in which the ion implantation process is carried out with respect to a wafer W. The parts identical to the parts of the first and second embodiments will not be further described to avoid redundancy. Provided in the ion implantation chamber 700 are an ion current measuring section 610 for measuring the ion current of the ribbon ion beam 32, an angle varying section 650 connected to the ion current measuring section 610 so as to vary an alignment angle of the ion current measuring section 610, and an inclination angle calculating section (not shown) connected to the ion current measuring section 610 and the angle varying section 650 so as to calculate the inclination angle of the ribbon ion beam 32.

The ion current measuring section 610 includes a Faraday cup assembly 612, a current/voltage converting part (not shown), and a voltage measuring part (not shown. The angle varying section 650 includes first and second motors 654 and 660 for rotating the Faraday cup assembly 612 and first and second encoders 672 and 674 for measuring rotation angles of the first and second motors 654 and 660. The inclination angle calculating section includes a data analyzer 682 and a first angle adjusting part 684. The data analyzer analyzes the variation of the ion current according to the variation of the alignment angle of the Faraday cup assembly 612 so as to detect the maximum value of the ion current and calculates the inclination angle of the ribbon ion beam 32 based on the alignment angle of the Faraday cup assembly 612 corresponding to the maximum value of the ion current. The first angle adjusting part 684 generates a control signal to adjust the alignment angle of the Faraday cup assembly 612. In addition, a power supply 686, which supplies power for operating the first and second motors 654 and 660, is connected to the first angle adjusting part 684. A display device 688 is connected to the data analyzer 682 for displaying the ion current measuring value and the rotation angle of the Faraday cup assembly 612.

In addition, the Faraday cup assembly 612 is installed in the first bracket 652 through a first driving shaft and a first rotating shaft. A first base plate 662, a first pneumatic cylinder 664, and a second pneumatic cylinder 670 are provided at a lower portion of the first bracket 652. The Faraday cup assembly 612 is driven up and down by the first pneumatic cylinder 664, and is horizontally driven by the second pneumatic cylinder 670. The second pneumatic cylinder 670 is supported by a moving block 666 installed in a linear motion guide 668 which is mounted on a supporting member 702 provided at an inner wall of the ion implantation chamber 700.

The first pneumatic cylinder 664 and the second pneumatic cylinder 670 are connected to a directional valve 688, which is operated by a first position control section 692, and are operated by the flow of pressurized air, which is controlled by the directional valve 688.

An electrostatic chuck 704 is provided at one side of the Faraday cup assembly 612 for fixing the wafer W. A second base plate 706 is provided at a lower surface of the electrostatic chuck 704 and a third motor 708 is connected to one side of the second base plate 706 for adjusting the incident angle of the ribbon ion beam 32 with respect to the wafer W based on a first inclination angle of the ribbon ion beam 32. The third motor 708 and the second base plate 706 are installed in a second bracket 710 having a shape similar to a shape of the first bracket 652 through a third driving shaft (not shown) and a second rotating shaft (not shown). A third base plate 712 is provided at a lower portion of the second base plate 706, and a fourth driving shaft (not shown) extends by vertically passing through one side of the third base plate 712. An upper end of the fourth driving shaft is connected to the second bracket 710, and a lower end of the fourth driving shaft is connected to a fourth motor 714. The fourth motor 714 adjusts the incident angle of the ribbon ion beam 32 based on a second inclination angle of the ribbon ion beam 32.

In addition, a fifth motor 716 for rotating the electrostatic chuck 704 is provided at a lower side of the second base plate 706. The third, fourth and fifth motors 708, 714 and 716 are respectively provided with third, fourth and fifth encoders 718, 720 and 722. The third, fourth and fifth motors 708, 714 and 716 are controlled by a second angle adjusting part 724, and third, fourth and fifth rotation angles measured by the third, fourth and fifth encoders 718, 720 and 722 are transferred to the second angle adjusting part 718.

A supporting shaft 726 for supporting the third base plate 712 is installed at the lower side of the third base plate 712. A screw 730 is provided at one side of the supporting shaft 726. The screw 730 is connected to a sixth motor 728, which supplies the driving force for driving the third base plate 712 up and down. The supporting shaft 726 is connected to the screw 730 through a ball bearing assembly 732. The sixth motor 728 is controlled by a second position control section 734. In one embodiment, a ball screw type driving device is used for driving the third plate up and down. However, various linear driving devices, such as a pneumatic cylinder or a liner motor, can be used for driving the third plate up and down.

In addition, a main control section 736 for controlling the whole ion implantation process is connected to the first angle adjusting part 684, the first position control section 692, the second angle adjusting part 724, the second position control section 734, and the data analyzer 682. The second angle adjusting part 724 and the second position control section 734 are connected to the power supply 686, and the third to sixth motors 708, 714, 716 and 728 are also connected to the power supply 686.

Hereinafter, the operation of the ion implantation apparatus according to the third embodiment will be described with reference to the accompanying drawings.

Firstly, the Faraday cup assembly 612 is positioned on an advancing path of the ribbon ion beam 32 for measuring the inclination angle of the ribbon ion beam 32. The main control section 736 sends an order for measuring the inclination angle of the ribbon ion beam 32 to the first position control section 692, and the first position control section 692 operates the directional valve 688 so as to expand the first pneumatic cylinder 664. At this time, the first position control section 692 selectively operates the second pneumatic cylinder 670 through the directional valve 688 so as to precisely adjust the position of the Faraday cup assembly 612.

Then, the first angle adjusting part 684 operates the first and second motors 654 and 660 to rotate the Faraday cup assembly 612 and the ion current measuring section 610 measures the first and second variations of the ion current according to the rotation of the Faraday cup assembly 612. The data analyzer 682 connected to the ion current measuring section 610 detects the first and second maximum values of the ion current based on the first and second variations of the ion current and calculates the first and second inclination angles of the ion beam 32 from the first and second rotation angles of the Faraday cup assembly 612, which are corresponding to the first and second maximum values of the ion current. The process for measuring the inclination angle of the ribbon ion beam 32 is explained in detail with reference to the ion beam inclination angle measuring apparatuses 400 and 500, so it will not be further described below.

When the inclination angle of the ribbon ion beam 32 has been measured, as shown in FIG. 18, the main control section 736, through the first position control section 692, causes the Faraday cup assembly 612 to descend, and places the wafer W on the electrostatic chuck 704 by means of a conveying robot (not shown). Then, the second position control section 734 operates the sixth motor 728 to place the electrostatic chuck 704 equipped with the wafer W in the advancing path of the ribbon ion beam 32. At this time, the wafer W is fixedly placed in the electrostatic chuck 704 by the electrostatic force of the electrostatic chuck 704.

Then, the main control section 736 sends data of the first and second rotation angles of the ribbon ion beam 32, which are transferred from the data analyzer 682, to the second angle adjusting part 724. At this time, the second angle adjusting part 724 operates the third and fourth motors 708 and 714 in order to adjust the incident angle of the ribbon ion beam 32 with respect to the wafer to a predetermined critical angle. At this time, a feedback control is carried out by the third and fourth rotation angles transferred from the third and fourth encoders 718 and 720.

Then, the ribbon ion beam 32 is supplied to the entire surface of the wafer W and the sixth motor 728 moves the electrostatic chuck 704 up and down so as to allow ions to be evenly implanted into the entire surface of the wafer W. At this time, the fifth motor 706 rotates the electrostatic chuck 704 step by step for preventing the shadow effect caused by the pattern formed on the entire surface of the wafer W.

When the ions have been implanted, the electrostatic chuck 704 is rotated to its initial position by the third and fourth motors 708 and 714, and the sixth motor 728 moves the electrostatic chuck 704 to an unloading position of the wafer W. Then, the wafer W is unloaded from the electrostatic chuck 704 by the conveying robot, and a new wafer is loaded on the electrostatic chuck 704.

If the spot beam is supplied instead of the ribbon ion beam 32, the incident angle of the spot ion beam is adjusted by the third and fourth motors 708 and 714, and the ions are implanted into the entire surface of the wafer W while driving the electrostatic chuck 704 up and down by means of the fifth and sixth motors 716 and 728. At this time, the Faraday cup assembly has one Faraday cup.

When it is not required to check the ion distribution in a width direction of a ribbon ion beam, a Faraday cup assembly having one Faraday cup can be used in relation to the ribbon ion beam.

According to the present invention, the inclination angle of the ion beam supplied from the ion source is measured through the ion current measuring section including the Faraday cup assembly, which is rotatably installed, the angle varying section for adjusting the alignment angle of the Faraday cup assembly, and the inclination angle measuring section for measuring the inclination angle of the ion beam based on the variation of the ion current caused by the variation of the alignment angle of the Faraday cup assembly. By measuring the inclination angle of the ion beam, the incident angle of the ion beam incident into the wafer during the ion implantation process can be precisely adjusted to the predetermined critical angle.

Accordingly, the channeling effect and the shadow effect generated in the ion implantation process can be effectively prevented. In addition, the amount of ions implanted into the wafer can be precisely adjusted by precisely measuring the amount of ions included in the ion beam.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A method of measuring an inclination angle of an ion beam, comprising:
   a) receiving the ion beam supplied from an ion source;
   b) measuring a variation of an ion current of the ion beam while varying an angle at which the ion beam is received; and
   c) calculating the inclination angle of the ion beam based on the variation of the ion current.

2. The method as claimed in claim 1, wherein the ion beam is received in a Faraday cup assembly.

3. The method as claimed in claim 2, wherein a central axis of the ion source is horizontally arranged.

4. The method as claimed in claim 3, wherein step b) includes the substeps of measuring a first variation of the ion current by rotating the Faraday cup assembly about a horizontal axis, which is vertically crossed with a vertical plane including the central axis of the ion source and passes through the Faraday cup assembly, and measuring a second variation of the ion current by rotating the Faraday cup assembly about a vertical axis, which passes through a cross point of the central axis of the ion source and the horizontal axis.

5. The method as claimed in claim 4, wherein a first maximum value of the ion current is detected from the first variation, a second maximum value of the ion current is detected from the second variation, and the inclination angle of the ion beam is calculated based on first and second rotation angles of the Faraday cup assembly which are corresponding to the first and second maximum values of the ion current.

6. The method as claimed in claim 1, wherein the ion current to be measured is converted into an ion voltage.

7. The method as claimed in claim 1, further comprising displaying the variation of the ion current.

8. A method for measuring an inclination angle of an ion beam, comprising:
   a) installing a Faraday cup assembly in an advancing path of the ion beam supplied from an ion source to receive the ion beam;
   b) measuring a first variation of the ion current caused by the ion beam received in the Faraday cup assembly by rotating the Faraday cup assembly about a horizontal axis, which is vertically crossed with a vertical plane including a central axis of the ion source and passes through the Faraday cup assembly;
   c) detecting a first maximum value of the ion current from the first variation and calculating a first inclination angle of the ion beam based on a first rotation angle, which corresponds to the first maximum value, of the Faraday cup assembly rotated about the horizontal axis;
   d) measuring a second variation of the ion current by rotating the Faraday cup assembly about a vertical axis, which passes through a cross point of the central axis of the ion source and the horizontal axis; and
   e) detecting a second maximum value of the ion current based on the second variation, and calculating a second inclination angle of the ion beam based on a second rotation angle, which corresponds to the second maximum value, of the Faraday cup assembly rotated about the vertical axis.

9. The method as claimed in claim 8, further comprising displaying the first variation of the ion current and displaying the second variation of the ion current.

10. A method for implanting ions, comprising:
   a) receiving an ion beam supplied from an ion source;
   b) measuring a variation of an ion current of the ion beam while varying an angle at which the ion beam is received;
   c) calculating an inclination angle of the ion beam based on an angle of the received ion beam and the variation of the ion current;
   d) placing a wafer having a critical angle corrected according to the inclination angle of the ion beam in an advancing path of the ion beam; and e) implanting ions of the ion beam into an entire surface of the wafer while moving the wafer.

11. An apparatus for measuring an inclination angle of an ion beam, comprising:

a first means for receiving the ion beam supplied from an ion source, and for measuring an ion current of the received ion beam;

a second means for varying an alignment angle of the first means to adjust an amount of the ion beam received in the first means; and a third means for calculating the inclination angle of the ion beam based on the alignment angle of the first means and the variation of the ion current caused by the variation of the alignment angle of the first means.

12. The apparatus as claimed in claim 11, wherein the first means includes:

a Faraday cup assembly for receiving the ion beam;

a fourth means connected to the Faraday cup assembly for converting the ion current generated from the Faraday cup assembly into an ion voltage;

and a voltage measuring section for measuring the ion voltage and sending measured data to the third means.

13. The apparatus as claimed in claim 12, wherein the Faraday cup assembly includes:

a Faraday cup for receiving the ion beam;

a bias ring provided at an inlet of the Faraday cup and connected to a bias power for restraining a generation of secondary electrons due to the ion beam received in the Faraday cup;

an insulation ring provided between the Faraday cup and the bias ring;

a cover provided at one side of the bias ring and formed with an opening through which the ion beam passes; and a cooling ring provided between the cover and the bias ring for receiving cooling water for preventing a temperature from being raised caused by the ion beam.

14. The apparatus as claimed in claim 13, wherein the cover comprises graphite.

15. The apparatus as claimed in claim 12, wherein the fourth means comprises a capacitor for storing the ion current.

16. The apparatus as claimed in claim 12, wherein the fourth means includes:

an amplifier connected to the Faraday cup assembly so as to amplify the ion current generated from the Faraday cup assembly;

a buffer, including a capacitor for storing the ion current amplified by the amplifier and an operational amplifier connected to the capacitor, the buffer supplying the ion voltage stored in the capacitor to the voltage measuring section; and a switch for connecting the amplifier to the buffer.

17. The apparatus as claimed in claim 16, further comprising a switch control section for controlling an opening/closing time of the switch based on a predetermined sampling time.

18. The apparatus as claimed in claim 11, wherein the ion beam has a ribbon shape having a predetermined width.

19. The apparatus as claimed in claim 18, wherein the first means includes:

a Faraday cup assembly including: a plurality of Faraday cups which are connected to each other in a row in a width direction of the ion beam to receive the ion beam;

a bias plate provided at inlets of the Faraday cups and connected to a bias power for restraining a generation of secondary electrons due to the ion beam received in the Faraday cups;

an insulation plate provided between the Faraday cups and the bias plate;

a cover provided at one side of the bias plate and formed with a plurality of openings through which the ion beam passes; and a cooling plate provided between the cover and the bias plate for receiving cooling wafer for preventing a temperature from being raised caused by the ion beam;

a fourth means connected to the Faraday cup assembly for converting the ion current generated from the Faraday cup assembly into an ion voltage; and a voltage measuring section for measuring the ion voltage and sending measured data to the third means.

20. The apparatus as claimed in claim 19, wherein the fourth means includes a plurality of capacitors connected to the Faraday cups for storing the ion current, and a selection switch for selectively or sequentially connecting the capacitors to the voltage measuring section.

21. The apparatus as claimed in claim 19, wherein the fourth means includes:

a plurality of amplifiers, connected to the Faraday cups, for amplifying the ion current generated from the Faraday cups;

a plurality of buffers, including a plurality of capacitors for storing the ion current amplified by the amplifiers and a plurality of operational amplifiers connected to the capacitors and supplying the ion voltage stored in the capacitors to the voltage measuring section; and a selection switch for selectively connecting the amplifiers to the buffers.

22. The apparatus as claimed in claim 21, further comprising a switch control section for controlling an opening/closing time of the selection switch based on a predetermined sampling time.

23. The apparatus as claimed in claim 11, wherein the first means includes a Faraday cup assembly for receiving the ion beam, and wherein the second means includes:

a driving means for rotating the Faraday cup assembly about a horizontal axis, which is vertically crossed with a vertical plane including the central axis of the ion source and passes through the Faraday cup assembly, and for rotating the Faraday cup assembly about a vertical axis, which passes through a cross point of the central axis of the ion source and the horizontal axis; and an angle measuring means for measuring a first rotation angle of the Faraday cup assembly rotated about the horizontal axis and a second rotation angle of the Faraday cup assembly rotated about the vertical axis.

24. The apparatus as claimed in claim 23, wherein the driving means includes a first motor for rotating the Faraday cup assembly about the horizontal axis, and a second motor for rotating the Faraday cup assembly about the vertical axis.

25. The apparatus as claimed in claim 23, wherein the angle measuring means includes a first encoder installed at one side of the first motor so as to measure the first rotation angle, and a second encoder installed at one side of the second motor so as to measure the second rotation angle.

26. The apparatus as claimed in claim 11, wherein the third means includes a data analyzing section for detecting a maximum value of the ion current by analyzing the variation of the ion current corresponding to the variation of the alignment angle of the first means and calculating the inclination angle of the ion beam based on the alignment angle of the first means corresponding to the maximum value of the ion current; and an angle adjusting section for adjusting the alignment angle of the first means.

27. The apparatus as claimed in claim 11, further comprising a display device for displaying the alignment angle of the first means and measured data of the ion current in real time.

28. The apparatus as claimed in claim 11, further comprising a driving means for driving the first means up and down.

29. An apparatus for measuring an inclination angle of an ion beam, comprising:
a Faraday cup assembly installed on an advancing path of the ion beam supplied from an ion source to receive the ion beam;
a current/voltage converting means for converting an ion current generated from the Faraday cup assembly due to the ion beam into an ion voltage;
a voltage measuring section for measuring the ion voltage;
a driving means for rotating the Faraday cup assembly about a horizontal axis, which is vertically crossed with a vertical plane including the central axis of the ion source and passes through the Faraday cup assembly, to vary a first alignment angle of the Faraday cup assembly and for rotating the Faraday cup assembly about a vertical axis, which passes through a cross point of the central axis of the ion source and the horizontal axis, to vary a second alignment angle of the Faraday cup assembly;
an angle measuring means for measuring a first rotation angle of the Faraday cup assembly rotated about the horizontal axis and a second rotation angle of the Faraday cup assembly rotated about the vertical axis;
a data analyzing section connected to the voltage measuring section for detecting first and second maximum values of ion current measuring data by analyzing first and second variations of the ion current measuring data corresponding to the first and second alignment angles of the Faraday cup assembly and for calculating the inclination angle of the ion beam based on the first and second rotation angles corresponding to the first and second maximum values; and
an angle adjusting section for generating a control signal to adjust the first and second alignment angles of the Faraday cup assembly.

30. The apparatus as claimed in claim 29, wherein the Faraday cup assembly includes: a Faraday cup for receiving the ion beam;
a bias ring provided at an inlet of the Faraday cup and connected to a bias power for restraining secondary electrons generated by the ion beam received in the Faraday cup;
an insulation ring provided between the Faraday cup and the bias ring;
a cover provided at one side of the bias ring and formed with an opening through which the ion beam passes;
and a cooling ring provided between the cover and the bias ring for receiving cooling wafer for preventing a temperature from being raised caused by the ion beam.

31. The apparatus as claimed in claim 29, further comprising a display device for displaying the first and second rotation angles of the Faraday cup assembly and the first and second variations of the ion voltage in real time.

32. An ion implantation apparatus, comprising:
an ion implantation chamber for performing an ion implantation process with respect to a wafer and including a chuck for gripping the wafer;
an ion source connected to the ion implantation chamber for supplying an ion beam including ions into the ion implantation chamber;
an ion current measuring means installed in an advancing path of the ion beam when measuring an inclination angle of the ion beam for receiving the ion beam and for measuring an ion current of the ion beam received therein;
an angle varying means for varying an alignment angle of the ion current measuring means so as to adjust an amount of the ion beam received in the ion current measuring means;
an inclination angle calculating means for calculating the inclination angle of the ion beam based on the alignment angle of the ion current measuring means and a variation of the ion current caused by a variation of the alignment angle of the ion current measuring means;
a first driving means for driving the ion current measuring means up and down; and
a second driving means for placing the wafer in the advancing path of the ion beam while ions are being implanted into the wafer, rotating the wafer with a critical angle corrected according to the inclination angle of the ion beam, and moving the wafer for allowing ions to be implanted into a whole area of the wafer.

33. The ion implantation apparatus as claimed in claim 32, wherein the ion current measuring means includes:
a Faraday cup assembly, including:
a Faraday cup for receiving the ion beam;
a bias ring provided at an inlet of the Faraday cup and connected to a bias power for restraining secondary electrons generated by the ion beam received in the Faraday cup;
an insulation ring provided between the Faraday cup and the bias ring;
a cover provided at one side of the bias ring and formed with an opening through which the ion beam passes;
and a cooling ring provided between the cover and the bias ring for receiving cooling wafer for preventing a temperature from being raised caused by the ion beam;
a current/voltage converting means connected to the Faraday cup for converting the ion current generated from the Faraday cup into an ion voltage;
a voltage measuring section for measuring the ion voltage and sending measured data of the ion voltage to the inclination angle calculating means.

34. The ion implantation apparatus as claimed in claim 32, wherein the angle varying means includes:
a third driving means for rotating the Faraday cup assembly about a horizontal axis, which is vertically crossed with a vertical plane including the central axis of the ion source and passes through the Faraday cup assembly, and for rotating the Faraday cup assembly about a vertical axis, which passes through a cross point of the central axis of the ion source and the horizontal axis; and
an angle measuring means for measuring a first rotation angle of the Faraday cup assembly rotated about the horizontal axis and a second rotation angle of the Faraday cup assembly rotated about the vertical axis.

35. The ion implantation apparatus as claimed in claim 32, wherein the inclination angle calculating means includes:

a data analyzing section for detecting a maximum value of the ion current by analyzing the variation of the ion current according to the variation of the alignment angle of the Faraday cup assembly and for calculating the inclination angle of the ion beam based on the alignment angle of the Faraday cup assembly corresponding to the maximum value of the ion current; and an angle adjusting section for adjusting the alignment angle of the Faraday cup assembly.

36. The ion implantation apparatus as claimed in claim 32, further comprising:

a first control section for controlling an operation of the first driving means in such a manner that the Faraday cup assembly is placed in the advancing path of the ion beam while the inclination angle of the ion beam is being measured and is placed below the advancing path of the ion beam while ions are being implanted into the wafer; and a second control section for controlling an operation of the second driving means in such a manner that the wafer is placed in the advancing path of the ion beam with a critical angle corrected according to the inclination angle of the ion beam while the ions are being implanted into the wafer.

* * * * *